United States Patent
Aibara

(10) Patent No.: US 9,762,809 B2
(45) Date of Patent: Sep. 12, 2017

(54) SEMICONDUCTOR DEVICE

(71) Applicant: Renesas Electronics Corporation, Tokyo (JP)

(72) Inventor: Yasutoshi Aibara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/186,211

(22) Filed: Jun. 17, 2016

(65) Prior Publication Data

US 2017/0064237 A1    Mar. 2, 2017

(30) Foreign Application Priority Data

Aug. 28, 2015   (JP) .................................. 2015-168637

(51) Int. Cl.
*H04N 5/235* (2006.01)
*H04N 5/355* (2011.01)
(Continued)

(52) U.S. Cl.
CPC ............ *H04N 5/2357* (2013.01); *H03M 1/56* (2013.01); *H04N 5/35554* (2013.01); *H04N 5/35581* (2013.01); *H04N 5/378* (2013.01); *H04N 5/3742* (2013.01); *H04N 5/37455* (2013.01); *G06T 2207/20208* (2013.01)

(58) Field of Classification Search
CPC .... H04N 5/378; H04N 5/243; H04N 5/35554; H04N 5/35581; H04N 5/235; H04N 5/2355; H04N 5/37455; H04N 5/3745; H04N 5/2351–5/2353; H04N 5/355; H04N 5/35536; H04N 5/35563; H03M 1/56; H03M 1/186–1/187; G06T 2207/20208; G06T 2207/10144
See application file for complete search history.

(56) References Cited

U.S. PATENT DOCUMENTS 6,707,492 B1 * 3/2004 Itani ...................... H03M 1/187
                                                       341/139
7,362,365 B1 * 4/2008 Reyneri ................. H04N 3/155
                                                       348/297

(Continued)

FOREIGN PATENT DOCUMENTS

JP          2013-175936 A      9/2013

*Primary Examiner* — Michael Osinski
(74) *Attorney, Agent, or Firm* — McGinn IP Law Group, PLLC

(57) ABSTRACT

A problem in conventional semiconductor devices is that a frame rate for acquiring images cannot be increased. A semiconductor device according to one embodiment sets a slope of a ramp signal provided to an analog-to-digital converter for converting pixel signals into digital values such that it becomes large in a conversion process corresponding to short-time exposure whereas it becomes small in a conversion process corresponding to long-time exposure, sets a sweep time of the ramp signal such that it becomes short in the conversion process corresponding to the short-time exposure, whereas it becomes long in the conversion process corresponding to the long-time exposure, and generates two pieces of data such that the number of bits in a digital value corresponding to the short-time exposure will become smaller than the number of bits in the digital value corresponding to the long-time exposure.

12 Claims, 21 Drawing Sheets

(51) Int. Cl.
*H04N 5/374* (2011.01)
*H04N 5/378* (2011.01)
*H04N 5/3745* (2011.01)
*H03M 1/56* (2006.01)

(56) References Cited

U.S. PATENT DOCUMENTS

| | | | | |
|---|---|---|---|---|
| 7,605,852 B2* | 10/2009 | Olsen | | H04N 5/2352 |
| | | | | 348/229.1 |
| 7,907,079 B1* | 3/2011 | Galloway | | H03M 1/1014 |
| | | | | 341/155 |
| 8,089,530 B2* | 1/2012 | Mabuchi | | H03M 1/186 |
| | | | | 348/193 |
| 8,243,179 B2* | 8/2012 | Shoho | | H04N 5/35554 |
| | | | | 348/294 |
| 8,508,611 B2* | 8/2013 | Kasai | | G06T 7/254 |
| | | | | 348/222.1 |
| 8,760,213 B2* | 6/2014 | Saito | | H03K 3/0231 |
| | | | | 327/406 |
| 9,462,193 B2* | 10/2016 | Jannard | | H04N 5/235 |
| 9,641,779 B2* | 5/2017 | Aibara | | H04N 5/37455 |
| 2003/0043292 A1* | 3/2003 | Pyle | | H04N 5/2351 |
| | | | | 348/364 |
| 2008/0260298 A1* | 10/2008 | Kamon | | H04N 3/155 |
| | | | | 382/321 |
| 2011/0013046 A1* | 1/2011 | Hiyama | | H03M 1/06 |
| | | | | 348/222.1 |
| 2011/0025895 A1* | 2/2011 | Hasegawa | | H03M 1/14 |
| | | | | 348/294 |
| 2011/0121161 A1* | 5/2011 | Itzhak | | H04N 5/378 |
| | | | | 250/208.1 |
| 2011/0134298 A1* | 6/2011 | Aoyama | | H01L 27/14609 |
| | | | | 348/311 |
| 2011/0248145 A1* | 10/2011 | Tanaka | | H03M 1/144 |
| | | | | 250/208.1 |
| 2012/0127356 A1* | 5/2012 | Matsuura | | H04N 5/378 |
| | | | | 348/313 |
| 2012/0241594 A1* | 9/2012 | Noiret | | H04N 5/35536 |
| | | | | 250/208.1 |
| 2014/0218577 A1* | 8/2014 | Kanemitsu | | H04N 5/35563 |
| | | | | 348/302 |
| 2015/0181146 A1* | 6/2015 | Hashimoto | | H04N 5/378 |
| | | | | 348/229.1 |
| 2015/0244388 A1* | 8/2015 | Hashimoto | | H03M 1/34 |
| | | | | 348/322 |
| 2016/0021323 A1* | 1/2016 | Aibara | | H04N 5/378 |
| | | | | 348/294 |
| 2017/0111015 A1* | 4/2017 | Robert | | H03F 1/26 |

* cited by examiner

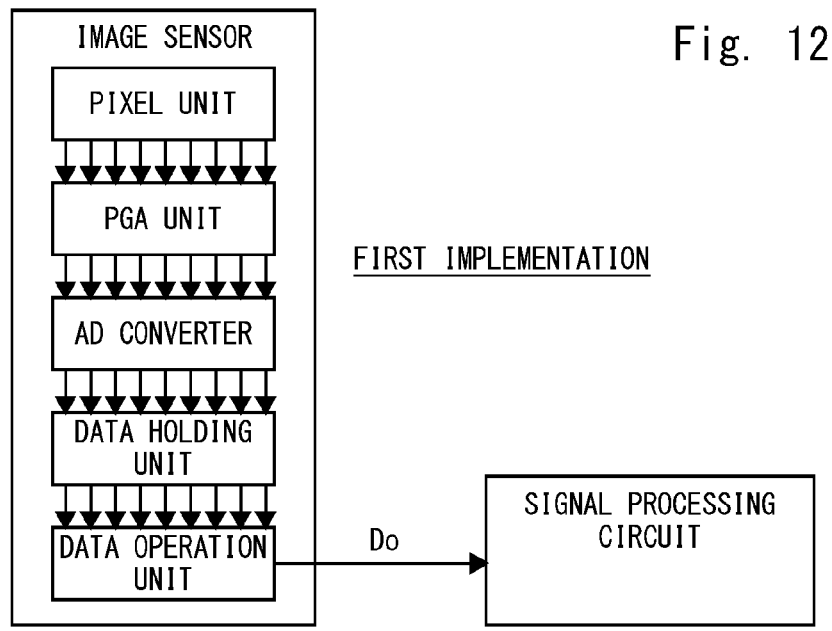
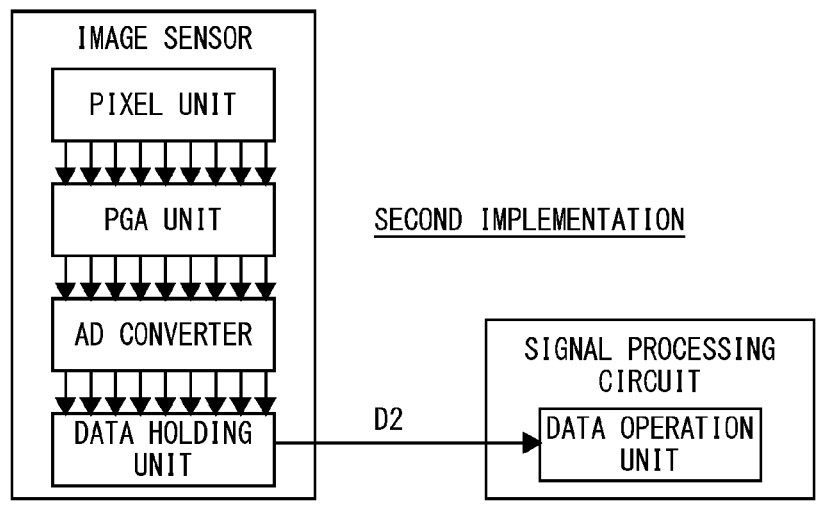
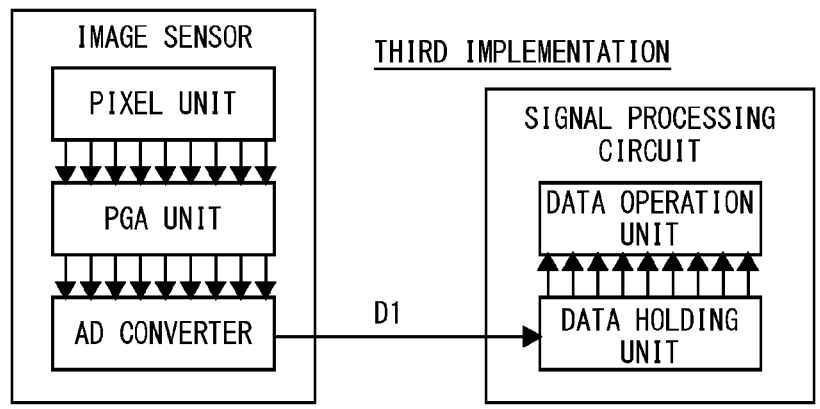
Fig. 12

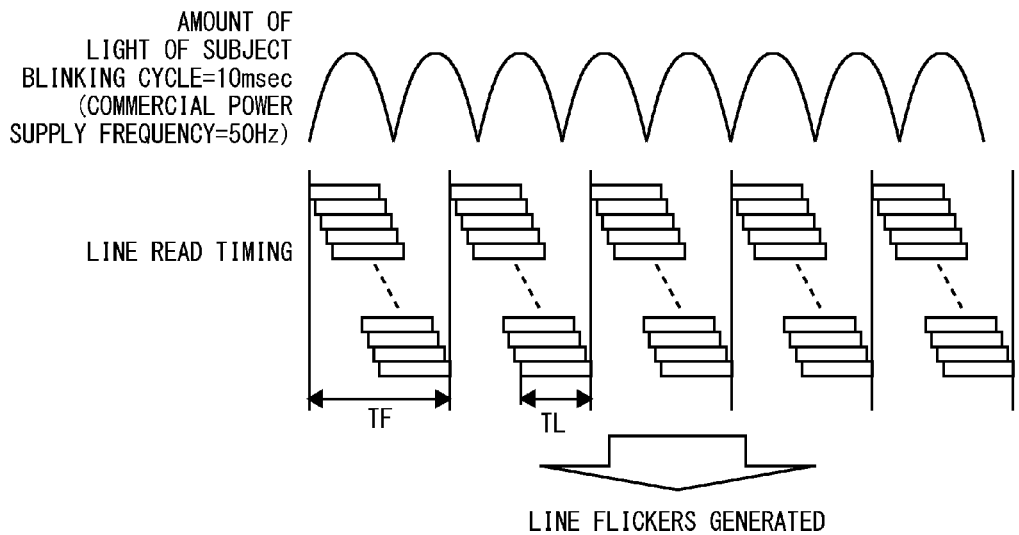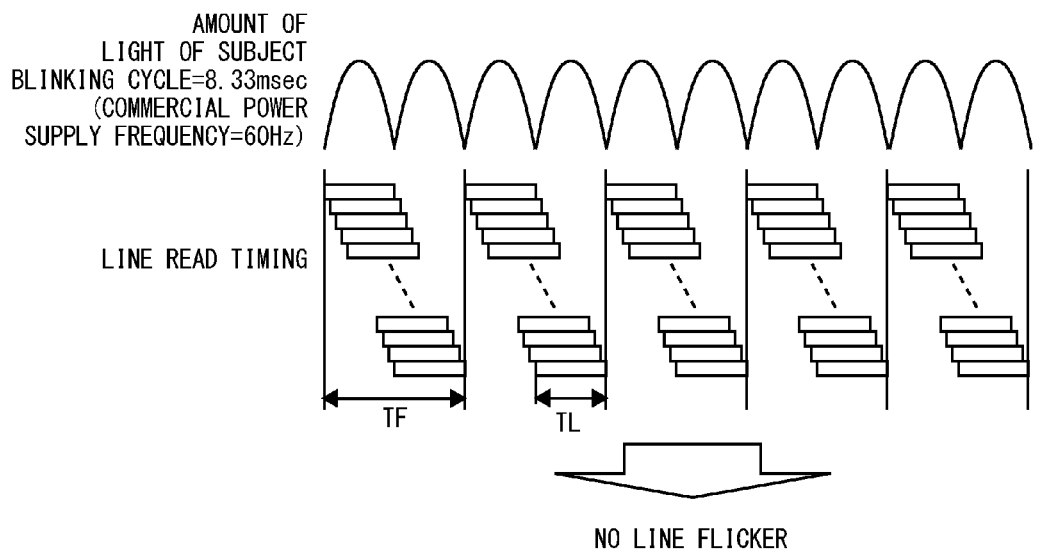
Fig. 14

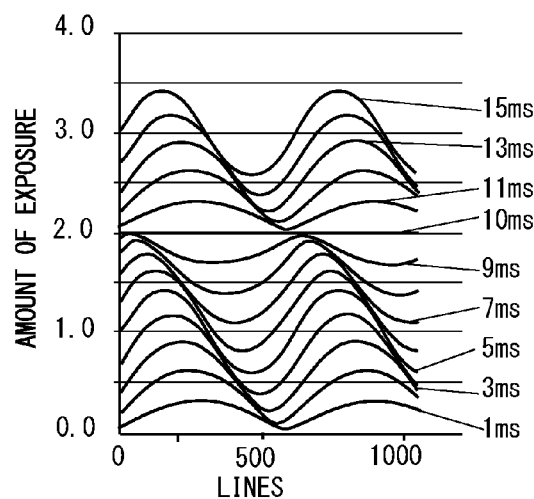
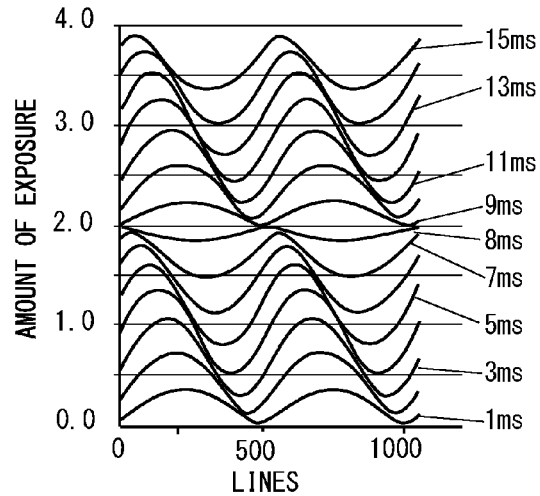
Fig. 15

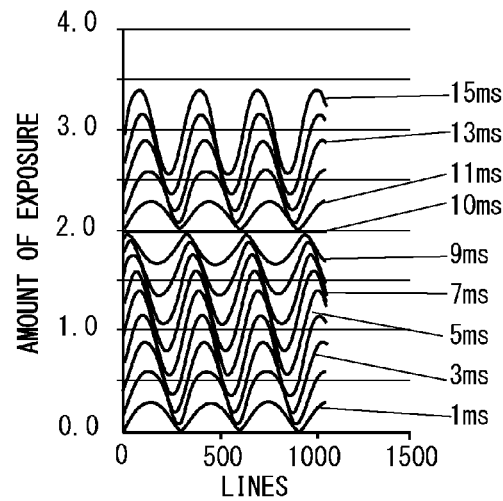
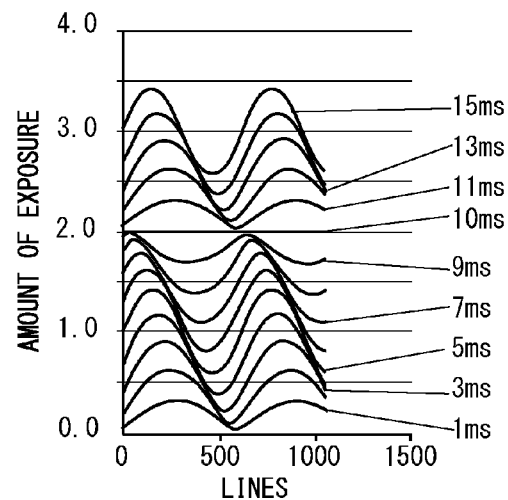
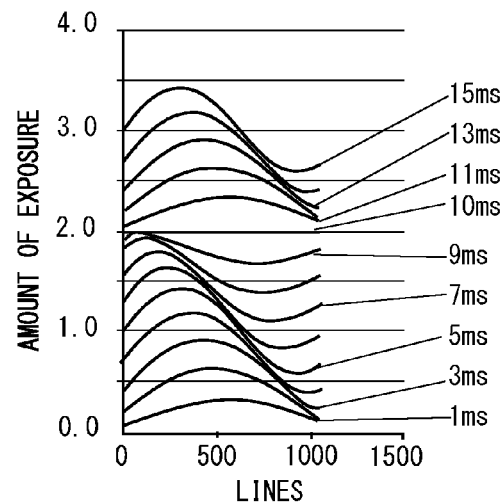
Fig. 16

SEMICONDUCTOR DEVICE

CROSS-REFERENCE TO RELATED APPLICATIONS

This application is based upon and claims the benefit of priority from Japanese patent application No. 2015-168637, filed on Aug. 28, 2015, the disclosure of which is incorporated herein in its entirety by reference.

BACKGROUND

The present invention relates to a semiconductor device, and to, for example, a semiconductor device including an analog-to-digital converter that utilizes a ramp signal when converting pixel signals obtained from pixels into digital values.

Various types of control have often been performed by image processing. To acquire images used for the image processing, a solid state image sensor such as a complementary metal oxide semiconductor (CMOS) image sensor is used. In recent years, there has been a demand to improve the quality of images acquired by the CMOS image sensor in order to improve an accuracy of the image processing. Thus, Japanese Unexamined Patent Application Publication No. 2013-175936 discloses a technique for improving the quality of images acquired by the CMOS image sensor.

In Japanese Unexamined Patent Application Publication No. 2013-175936, a ramp wave generating unit that outputs a ramp wave voltage, and an AD conversion unit that uses the ramp wave voltage to convert input analog signals corresponding to the amount of light incident on pixels into output digital signals, are provided. According to Japanese Unexamined Patent Application Publication No. 2013-175936, the ramp wave generating unit has a first current output DA conversion circuit that generates an output current according to first digital data, and an integrator that outputs a voltage corresponding to integration of a first output current as a ramp wave voltage.

SUMMARY

However, in the technique Japanese Unexamined Patent Application Publication No. 2013-175936, the present inventor has found a problem that a frame rate cannot be improved. Other objects and novel features will be apparent from the descriptions herein and attached drawings.

In an exemplary aspect of the present invention, a semiconductor device sets a slope of a ramp signal provided to an analog-to-digital converter for converting pixel signals into digital values such that it becomes large in a conversion process corresponding to short-time exposure whereas it becomes small in a conversion process corresponding to long-time exposure, sets a sweep time of the ramp signal such that it becomes short in the conversion process corresponding to the short-time exposure, whereas it becomes long in the conversion process corresponding to the long-time exposure, and generates two pieces of data such that the number of bits in a digital value corresponding to the short-time exposure will become smaller than the number of bits in the digital value corresponding to the long-time exposure.

According to the above aspect, the semiconductor apparatus can increase a frame rate.

BRIEF DESCRIPTION OF THE DRAWINGS

The above and other aspects, advantages and features will be more apparent from the following description of certain embodiments taken in conjunction with the accompanying drawings, in which:

FIG. 12 is a drawing for explaining an example of an implementation of the semiconductor device according to the first embodiment;

FIG. 14 is a drawing for explaining line flickers in image data;

FIG. 15 is a graph for explaining a relationship between pixel rows in image data and fluctuations in an amount of exposure;

FIG. 16 is a graph for explaining a relationship between pixel rows in image data and fluctuations in an amount of exposure;

DETAILED DESCRIPTION

First Embodiment

Figure 1:
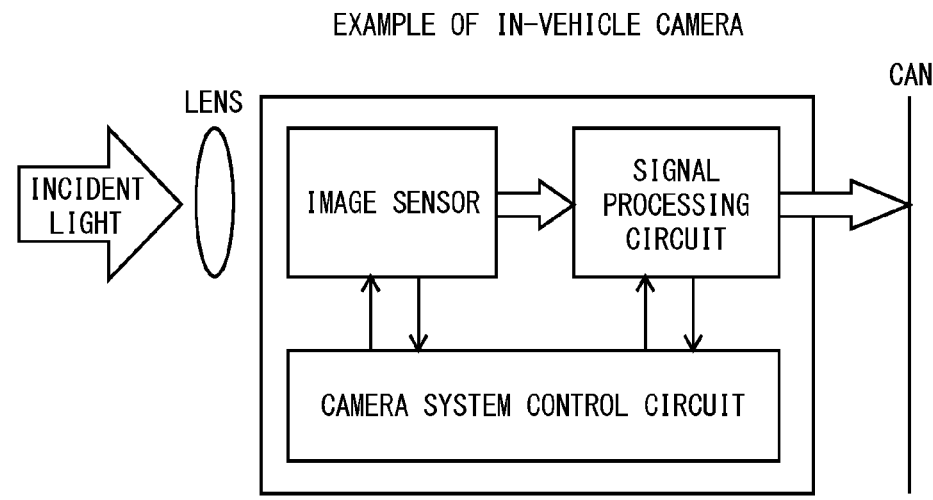
FIG. 1 is a block diagram showing a first example of a camera system to which a semiconductor device according to a first embodiment is applied.

To clarify the descriptions, some parts thereof and some of the drawings have been omitted or simplified as appropriate. Note that in the drawings, the same elements are denoted by the same reference signs, and repeated descriptions will be omitted as needed.

Description of Camera System

A semiconductor device according to a first embodiment has a pixel area in which pixels are arranged and a peripheral circuit that converts information on charge (hereinafter referred to as pixel signals) accumulated in the pixel area into pixel information and that outputs the pixel information. A semiconductor device including the pixel area and the peripheral circuit is hereinafter referred to as an image sensor. Firstly, a camera system including the image sensor will be described.

Figure 2:
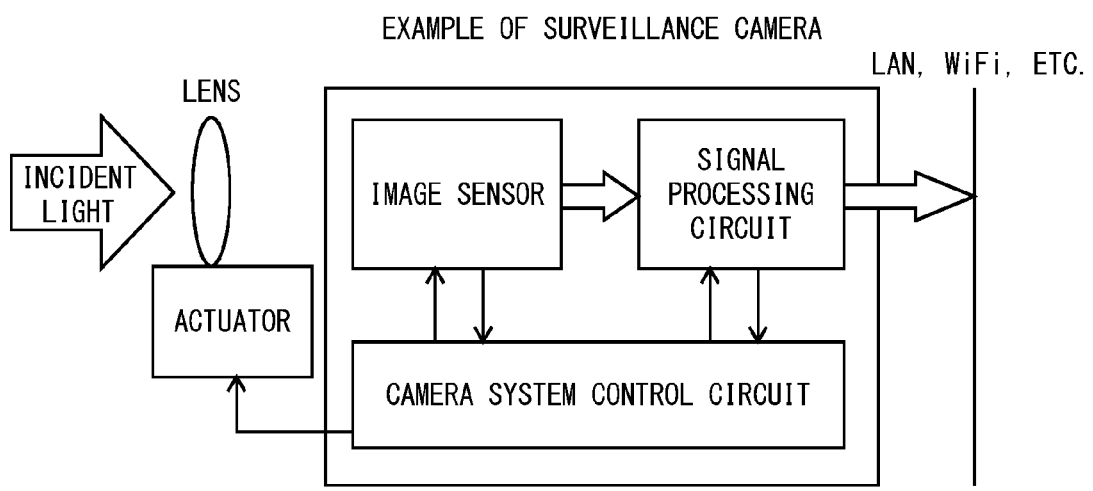
FIG. 2 is a block diagram showing a second example of a camera system to which a semiconductor device according to the first embodiment is applied.

FIGS. 1 and 2 are block diagrams of an example of a camera system to which the semiconductor device according to the first embodiment is applied. An example of the camera system in FIG. 1 is an in-vehicle camera. An example of the camera system in FIG. 2 is a camera system in a surveillance camera. The semiconductor device according to the first embodiment is an image sensor shown in FIGS. 1 and 2. In the camera system, an image sensor outputs image information according to light incident on the image sensor via a lens. Then, in the camera system, a signal processing circuit executes signal processing on the image information output by the image sensor and outputs information on signal processing results to a higher system connected to the signal processing circuit so as to succeed the signal processing circuit. In this regard, the signal processing circuit is connected to an in-vehicle network such as a Controller Area Network (CAN) in in-vehicle applications and to a general-purpose network such as a Local Area Network (LAN) in surveillance cameras.

Furthermore, in the camera system, general operations such as image taking timing and standby are controlled by a camera system control circuit. A lens often has a fixed focus in in-vehicle applications and has a variable focus in surveillance camera applications. Thus, in surveillance camera applications, an actuator that controls the focal distance of the lens is often provided.

In such in-vehicle applications or surveillance camera applications, under an image taking condition where, for example, the camera system is installed in a tunnel or in a dark environment at night and where images around an exit of the tunnel are taken or a part of the dark environment is lighted, blown out highlights (clipped whites) or blocked up shadows (crushed shadows) may occur when the camera system does not have a wide dynamic range. Furthermore, particularly in in-vehicle applications, it is very necessary to accurately take images of dark subjects, that is, low-illuminance subjects, such as nighttime pedestrians and obstacles, and license plates of oncoming cars visible between bright headlights of the cars. Thus, in in-vehicle applications or surveillance camera applications, there has been a demand to acquire images using a dynamic range with the above-described characteristics of the applications taken into account.

Description of Configuration of Image Sensor

Figure 3:
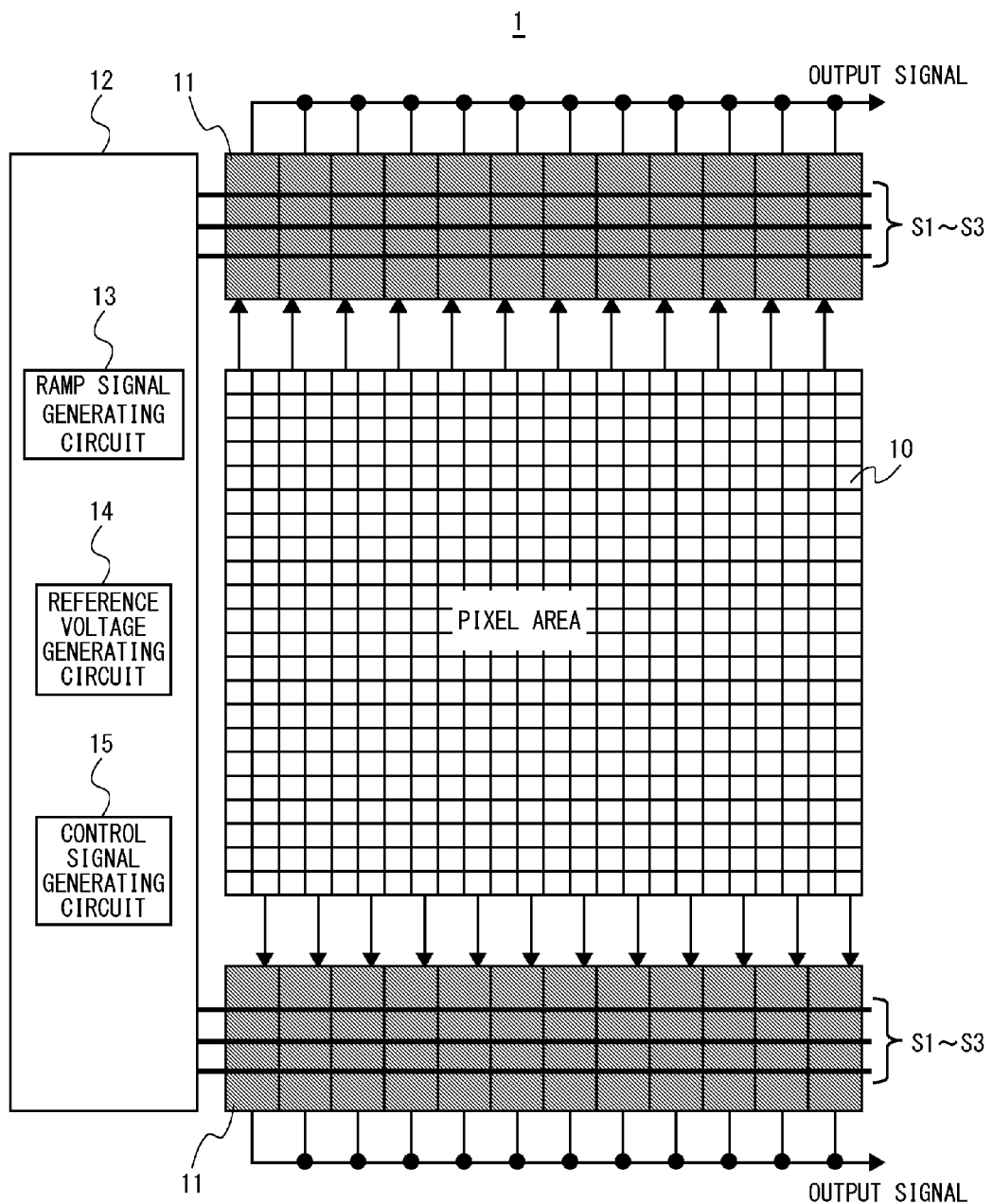
FIG. 3 is a block diagram of the semiconductor device according to the first embodiment.

Next, FIG. 3 is a block diagram of the semiconductor device (e.g., the image sensor 1) according to the first embodiment. As depicted in FIG. 3, the image sensor 1 according to the first embodiment has a pixel area 10, an analog-to-digital converter 11, and a control unit 12. Furthermore, the control unit 12 has a ramp signal generating circuit 13, a reference voltage generating circuit 14, and a control signal generating circuit 15.

The pixel area 10 stores charge according to the amount of incident light to output a pixel signal. In an example illustrated in FIG. 3, pixels are formed in a matrix in the pixel area 10. Each of the pixels stores charge for one pixel in image information. Pixel signals obtained from the pixels are read from each column.

The analog-to-digital converter 11 reads pixel signals from the pixel area 10 and uses a ramp signal to output digital values (output signals) according to the magnitudes of the pixel signals. The analog-to-digital converter 11 is provided for each column of the pixels in the pixel area 10. In the example shown in FIG. 3, the analog-to-digital converters 11 corresponding to odd-numbered columns in the pixel area 10 are arranged on an upper side, in the drawing, of the pixel area 10. The analog-to-digital converters 11 corresponding to even-numbered columns in the pixel area 10 are arranged on a lower side, in the drawing, of the pixel area 10. A specific configuration of the analog-to-digital converter 11 will be described later.

The control unit 12 outputs a ramp signal S1, a reference voltage signal S2, and an operation control signal S3 that control the analog-to-digital converter 11. In the image sensor 1, power supply wires and ground wires are arranged over an area where the analog-to-digital converters 11 are arranged in a direction traversing the area where the analog-to-digital converters 11 are arranged (in the direction in which the analog-to-digital converters 11 are arranged in juxtaposition); in FIG. 3, illustration of the wires is omitted. FIG. 3 depicts the ramp signal generating circuit 13, the reference voltage generating circuit 14, and the control signal generating circuit 15 as internal circuits of the control unit 12. However, the control unit 12 may include other circuits.

The ramp signal generating circuit 13 outputs the ramp signal S1 at predetermined timings. The reference voltage generating circuit 14 generates the reference voltage signal S2 utilized by the analog-to-digital converter 11, the ramp signal generating circuit 13, and the like. The control signal generating circuit 15 generates the operation control signal S3 that controls the analog-to-digital converter 11 and a control signal that controls operations of the ramp signal generating circuit 13. The ramp signal generating circuit 13, the reference voltage generating circuit 14, and the control signal generating circuit 15 will be described later in detail.

Description of Configuration of Analog-to-Digital Converter

Figure 4:
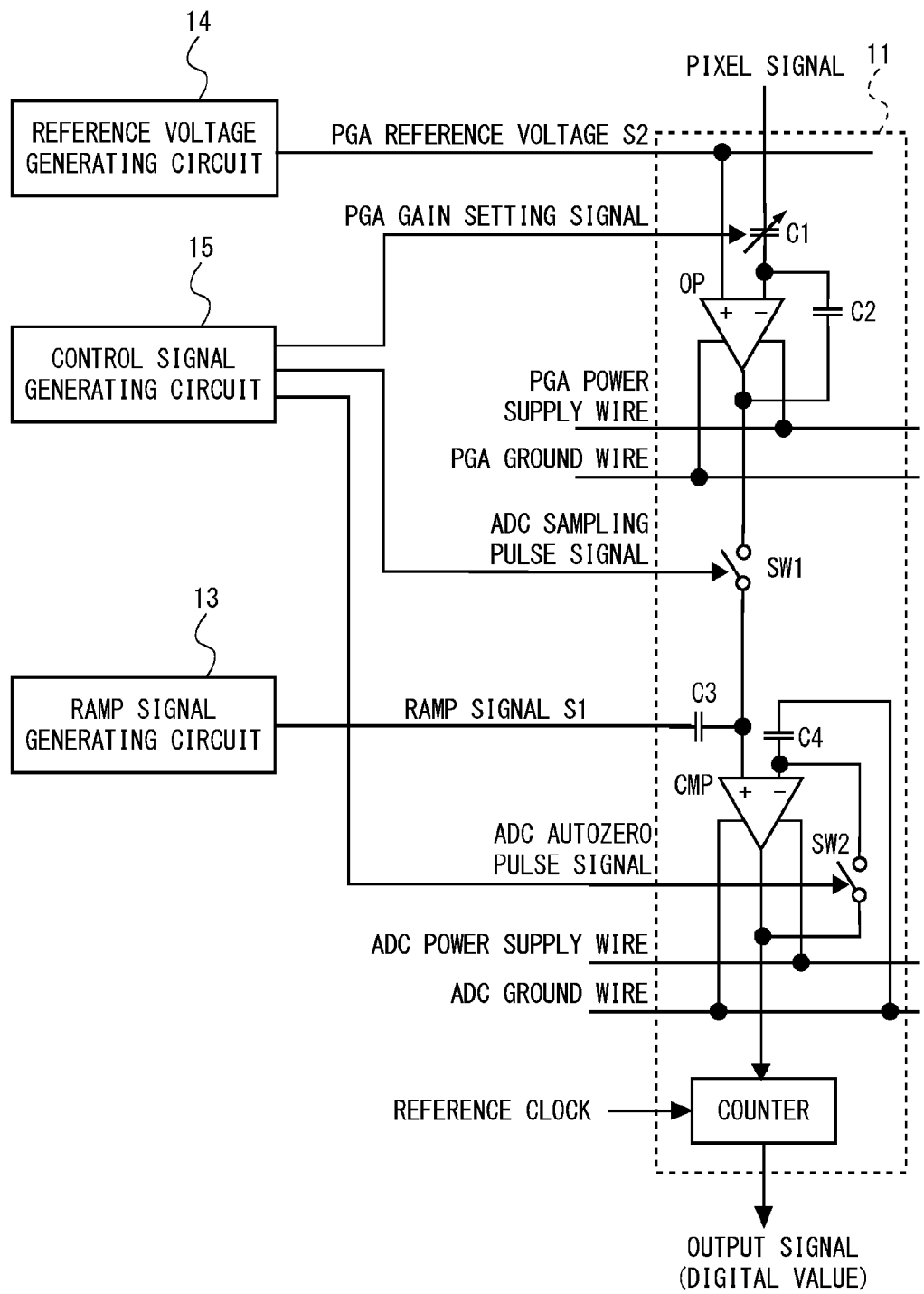
FIG. 4 is a block diagram of an analog-to-digital converter and a control unit of the semiconductor device according to the first embodiment.

Now, details of the analog-to-digital converter 11 will be described. FIG. 4 depicts a block diagram of the analog-to-digital converter 11 and the control unit 12 in the image sensor 1 according to the first embodiment. In FIG. 4, only the part of the control unit 12 that concerns the control on the analog-to-digital converter 11 according to the first embodiment is shown. As depicted in FIG. 4, the analog-to-digital converter 11 has an amplifier OP, a comparator CMP, capacitors C1 to C4, and switches SW1 and SW2. A Programmable Gain Amplifier (PGA) gain setting signal, an Analog to Digital Converter (ADC) sampling pulse signal, and an ADC autozero pulse signal that are shown in FIG. 4 are signals included in the operation control signal S3.

The amplifier OP receives pixel signals at an inverted input terminal via the capacitor C1. The capacitor C2 is provided between an output terminal and an output terminal of the amplifier OP. A non-inverted input terminal of the amplifier OP is provided with a PGA reference voltage from the reference voltage generating circuit 14. The capacitor C1 is a variable capacitance with a capacitance value determined by a PGA gain setting signal output by the control signal generating circuit 15. The amplifier OP and the capacitors C1 and C2 function as a programmable gain amplifier. The programmable gain amplifier uses the PGA gain setting signal to change the capacitance ratio between the capacitors C1 and C2, thereby varying an amplification rate for the pixel signals.

The capacitor C4 is connected between an inverted input terminal of the comparator CMP and the ground wire, and a non-inverted input terminal of the comparator CMP is connected to an output terminal of the amplifier OP with a switch SW1 interposed therebetween. A first end of the capacitor C3 is connected to a non-inverted input terminal of the comparator CMP. The ramp signal S1 from the ramp signal generating circuit 13 is input to a second end of the capacitor C3. Furthermore, the switch SW2 is connected between the inverted input terminal and output terminal of the comparator CMP. The switch SW1 has its open and close state controlled by an ADC sampling pulse signal output by the control signal generating circuit 15. The switch SW2 has its open and close state controlled by an ADC autozero pulse signal. The analog-to-digital converter 11 has a counter that counts a reference clock in accordance with an output value from the comparator CMP. The reference clock is output by an oscillation circuit or the like (not shown). When the magnitude relation between a signal level of the ramp signal S1 and a signal level of the pixel signal is inverted, the analog-to-digital converter 11 stops the counting operation of the counter and outputs a count value, which is a digital value, as of a time when the counting operation is stopped.

In this regard, the comparator CMP and the capacitors C3 and C4 function as a single slope integration AD conversion circuit. The single slope integration AD conversion circuit references the ramp signal S1 having a correlation with the count value in the counter that counts the output value from the comparator CMP. The single slope integration AD conversion circuit inputs the ramp signal S1 to the comparator CMP, compares an analog signal to be converted with the ramp signal S1, holds the count value obtained when the analog signal matches the ramp signal S1, and outputs the count value as an AD conversion result. In the example depicted in FIG. 4, the analog levels of pixel signals are held which are input from a programmable gain amplifier side to the capacitors C3 and C4. The single slope integration AD conversion circuit according to the first embodiment compares voltages resulting from charge accumulated in the two capacitors while changing the voltage level of the ramp signal S1 provided to the second end of the capacitor C3.

In order to maximize the performance of the analog-to-digital converter 11 and to reduce a decrease in S/N caused by quantization noise, the analog-to-digital converter 11 needs to perform, in a stage before the comparator CMP, analog gain control that amplifies a pixel signal to be converted to an optimum level for the dynamic range of the comparator CMP. Furthermore, the image sensor 1 according to the first embodiment changes the maximum voltage and slope of the ramp signal S1 output by the ramp signal generating circuit 13 to change the resolution of the analog-to-digital converter 11 with respect to the signal level of the pixel signal. To be more specific, in the image sensor 1 according to the first embodiment, the slope of the ramp signal S1 is changed according to an exposure time of a light-receiving element that is disposed in the pixel area 10 in order to change the number of bits in the digital value output by the analog-to-digital converter 11. For example, in the image sensor 1 according to the first embodiment, the number of bits in the digital value output in a short-time exposure period in which a high luminance part in an imaging area is captured in high definition is reduced (e.g., eleven bits), while the number of bits in the digital value output in a long-time exposure period in which a low luminance part in the imaging area is captured in high definition is increased (e.g., twelve bits).

Description of Configuration of Ramp Signal Generating Circuit

Figure 5:
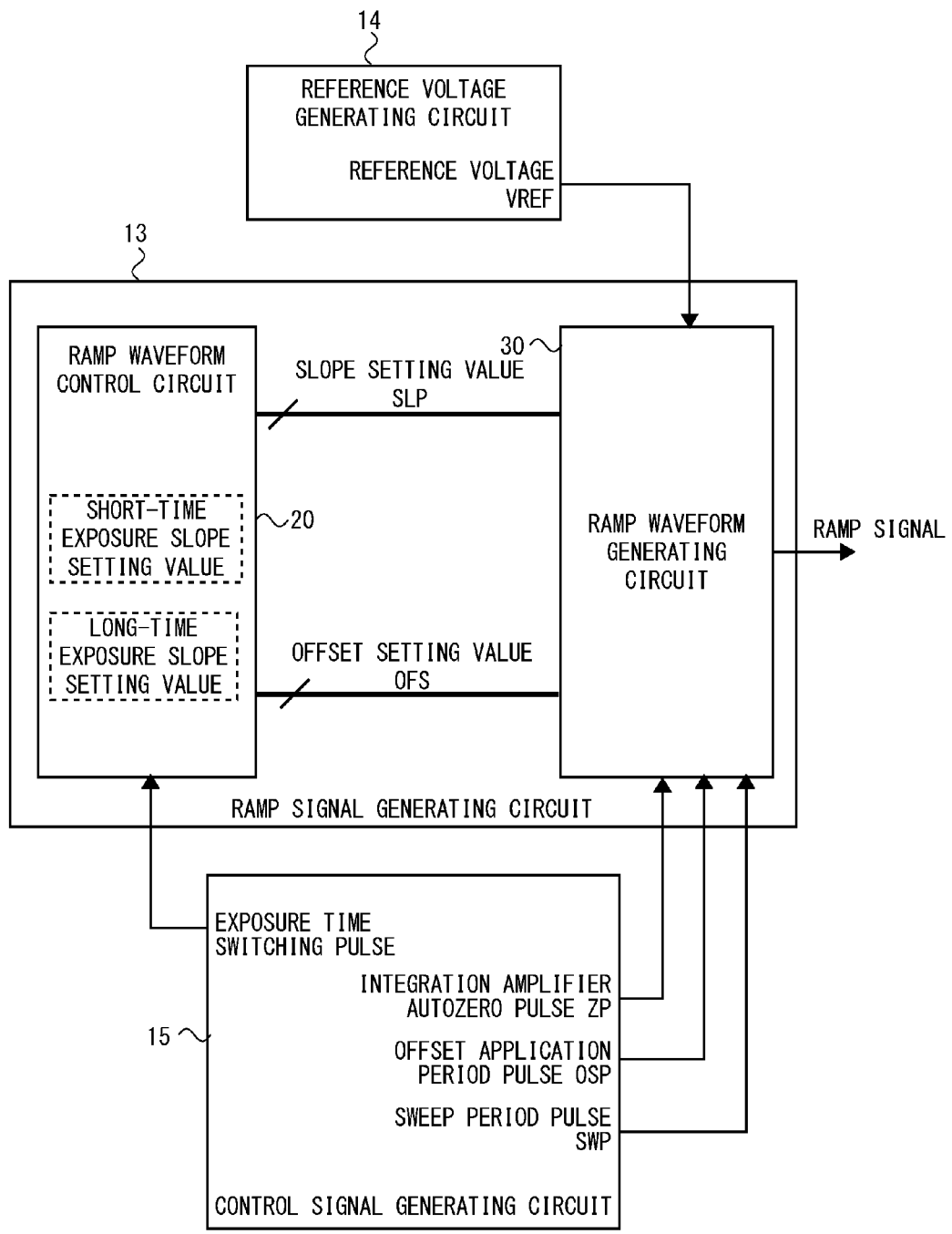
FIG. 5 is a specific block diagram of the control unit of the semiconductor device according to the first embodiment.

A detailed configuration of the ramp signal generating circuit 13 including the control unit 12 will be described below. FIG. 5 depicts a block diagram of the control unit 12 according to the first embodiment. In the example depicted in FIG. 5, only the part of the control unit 12 that concerns the control on the ramp signal generating circuit 13 is shown. As depicted in FIG. 5, the ramp signal generating circuit 13 has a ramp waveform control circuit 20 and a ramp waveform generating circuit 30.

The ramp waveform control circuit 20 is provided with an exposure time switching pulse output by the control signal generating circuit 15. The exposure time switching pulse indicates a length of an exposure time in which the incident light enters the light-receiving element disposed in the pixel area. More specifically, a logical level of the exposure time switching pulse is switched according to the length of the exposure time for the light-receiving element. The ramp waveform control circuit 20 stores a short-time exposure slope setting value and a long-time exposure slope setting value. The short-time exposure slope setting value specifies the slope of the ramp signal S1 that is used by the exposure time switching pulse to indicate a short-time exposure period, while the long-time exposure slope setting value specifies the slope of the ramp signal S1 used by the exposure time switching pulse to indicate a long-time exposure period and indicates a slope gentler than it is indicated by the short-time exposure slope setting value. Then, the ramp waveform control circuit 20 switches between the short-time exposure slope setting value and the long-time exposure slope setting value according to the exposure time switching pulse and outputs the selected slope setting value. In FIG. 5, the slope setting value output by the ramp waveform control circuit 20 is referred to as a slope setting value SLP.

The ramp waveform generating circuit 30 is provided with a reference voltage VREF that is output by the reference voltage generating circuit 14, an integration amplifier autozero pulse ZP, an offset application period pulse OSP, and a sweep period pulse SWP that are output by the control signal generating circuit 15. The integration amplifier autozero pulse ZP is a signal for resetting an output from an integration amplifier in the ramp waveform generating circuit 30. The offset application period pulse OSP is a signal for specifying a period in which the output from the integration amplifier in the ramp waveform generating circuit 30 is adjusted to an offset level. The sweep period pulse SWP is a signal for specifying a period in which the ramp waveform generating circuit 30 sweeps the ramp signal S1. Then, the ramp waveform generating circuit 30 outputs the ramp signal S1 having a slope according to the slope setting value output by the ramp waveform control circuit 20 in accordance with the sweep period pulse SWP.

The sweep period pulse SWP is output by the control signal generating circuit 15. The control signal generating circuit 15 sets a sweep time specified by the sweep period pulse SWP which is output in the period indicated by the exposure time switching pulse as being the short-time exposure period to be shorter than a sweep time specified by the sweep period pulse output in the period indicated by the exposure time switching pulse as being the long-time exposure period. The analog-to-digital converter 11 generates a first digital value corresponding to the short-time exposure period and a second digital value corresponding to the long-time exposure period.

Figure 6:
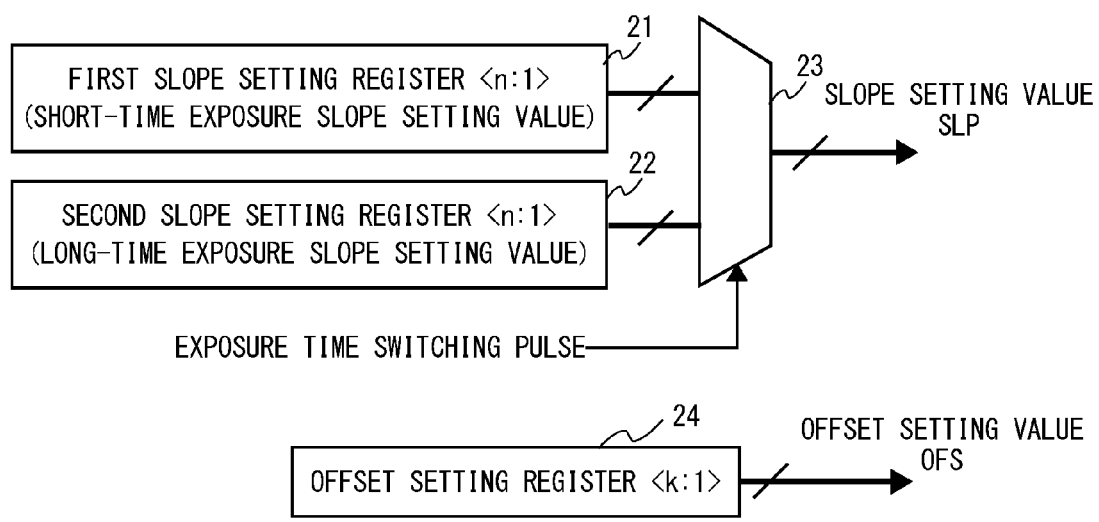
FIG. 6 is a block diagram of a ramp waveform control circuit of the semiconductor device according to the first embodiment.

Next, details of the ramp waveform control circuit 20 will be described. FIG. 6 depicts a block diagram of the ramp waveform control circuit 20 according to the first embodiment. As depicted in FIG. 6, the ramp waveform control circuit 20 has a short-time exposure slope setting unit 21, a long-time exposure slope setting unit 22, a selector 23, and an offset setting register 24.

The short-time exposure slope setting unit 21 outputs the short-time exposure slope setting value that is used when an analog-to-digital converting process is performed on an image signal obtained in the short-time exposure. In the image sensor 1 according to the first embodiment, the short-time exposure slope setting unit 21 has a first slope setting register that stores the short-time exposure slope setting value. The long-time exposure slope setting unit 22 outputs the long-time exposure slope setting value that is used when an analog-to-digital converting process is performed on an image signal obtained in the long-time exposure. In the image sensor 1 according to the first embodiment, the long-time exposure slope setting unit 22 has a second slope setting register that stores the long-time exposure slope setting value.

The selector 23 selects one of the short-time exposure slope setting value and the long-time exposure slope setting value according to the logical level of the exposure time switching pulse and outputs the selected setting value as the slope setting value SLP. The offset setting register 24 stores an offset setting value OFS for setting a voltage value for the initial ramp signal S1 during the initial slope period.

The short-time exposure slope setting value, the long-time exposure slope setting value, and the offset setting value are provided by a process control circuit that controls the image sensor 1 such as the camera system control circuit shown in FIGS. 1 and 2.

Figure 7:
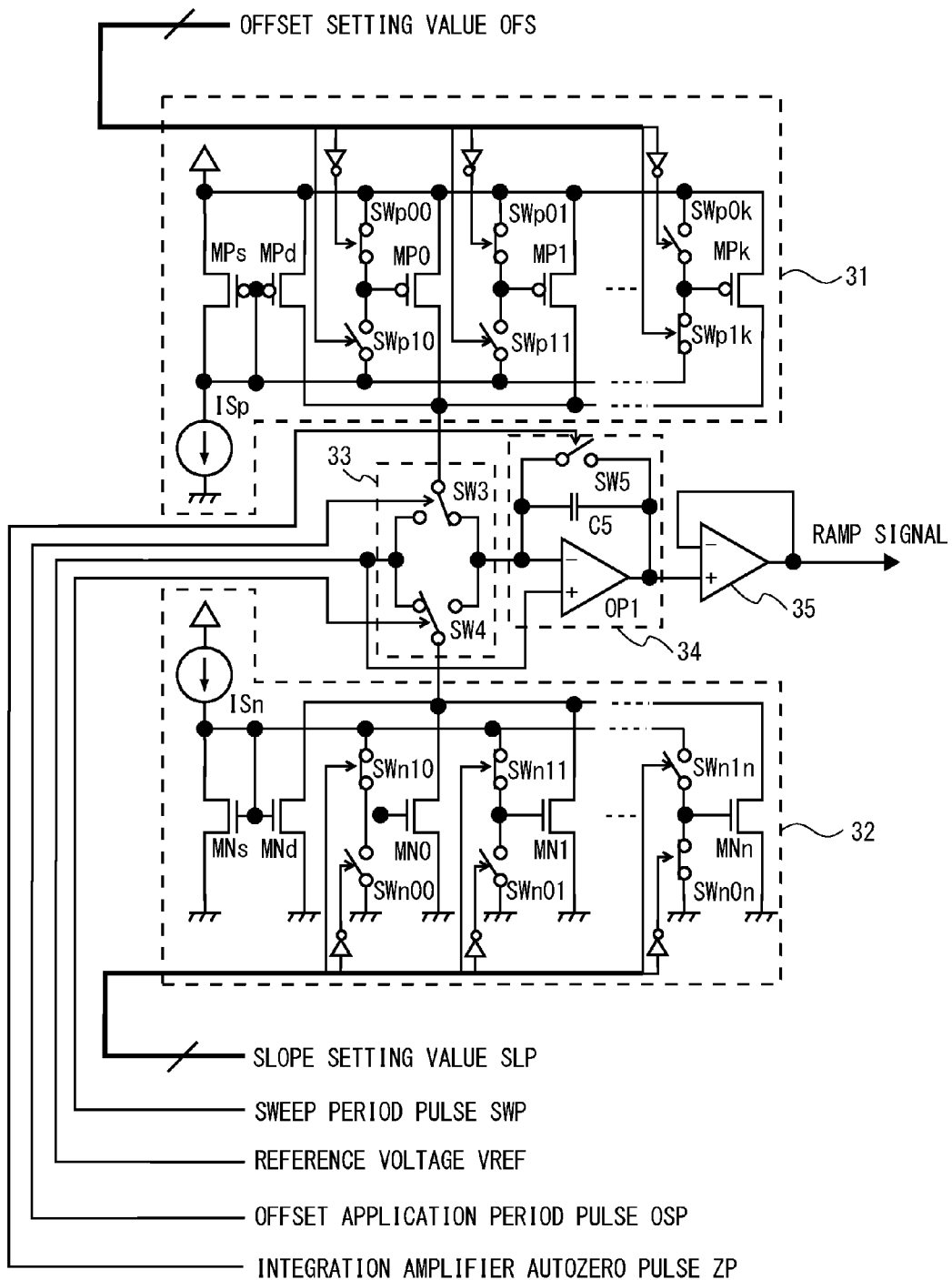
FIG. 7 is a block diagram of a ramp waveform generating circuit of the semiconductor device according to the first embodiment.

Next, the ramp waveform generating circuit 30 will be described. FIG. 7 depicts a block diagram of the ramp waveform generating circuit 30 according to the first embodiment. As depicted in FIG. 7, the ramp waveform generating circuit 30 according to the first embodiment has an offset current source 31, a current digital-to-analog conversion circuit 32, a waveform switching circuit 33, an integration circuit 34, and a buffer circuit 35.

The offset current source 31 outputs an offset current to the integration circuit 34 in accordance with the offset setting value. The offset current source 31 switches the mirror ratio of a current mirror circuit in accordance with the offset setting value to vary an offset current value. More specifically, the offset current source 31 has a current source ISp, PMOS transistors MPs, MPd, and MP0 to MPk (k at the end of MPk is indicative of an integer and is the same value as that of the number of bits in the offset setting value), and switches SWp00 to SWp0$k$, and SWp10 to SWp1$k$ (k at the end of SWp0$k$ and SWp1$k$ is indicative of an integer and is the same value as that of the number of bits in the offset setting value).

The offset current source 31 has a current mirror circuit in which the PMOS transistor MPs serves as a source side transistor and in which the PMOS transistors MPd and MP0 to MPn serve as branch side transistors. For the PMOS transistors MPs, MPd, and MP0 to MPk, a source is connected to the power supply wire. The drain of the PMOS transistor MPs is provided with a reference current from the current source ISp. The gates of the PMOS transistors MPs and MPd are connected together. Furthermore, the drain of the PMOS transistor MPs is connected to the gate of the PMOS transistor MPs and to the gate of the PMOS transistor MPd. The switches SWp00 to SWp0$k$ are provided between the power supply wire and the gates of the respective PMOS transistors MP0 to MPk. Furthermore, the switches SWp10 to SWp1$k$ are provided between the gate of the PMOS transistor MPs and the gates of the PMOS transistors MP0 to MPk. The switches SWp00 to SWp0$k$ and the switches SWp10 to SWp1$k$ each have its open and close state controlled in accordance with the value of a corresponding bit in the offset setting value. Additionally, the switches SWp00 to SWp0$k$ and the switches SWp10 to SWp1$k$ are controlled such that the open and close states of the switches are exclusive based on the value of the corresponding bit in the offset setting value. In other words, the offset current source 31 is controlled such that the number of branch side transistors in the current mirror circuit that output currents is set to any one of the values between 1 and k+1 according to the offset setting value, to enable the current value of the offset current to be switched in $2^k$ steps.

For the variable range of an output current from the current digital-to-analog conversion circuit 32, the mirror ratio of the current mirror circuit is set such that, when the output current serving as a reference is set to one, for example, the output current can be varied within a given change range from quarter to four times. The mirror ratio is set such that the output current from the current digital-to-analog conversion circuit 32 can be varied in $2^n$ steps.

The current digital-to-analog conversion circuit 32 outputs the output current with a magnitude according to a value output by the selector 29. The setting value output by the selector 29 is an n-bit value, and thus, the current digital-to-analog conversion circuit 32 can switch the current value of the output current in $2^n$ steps. The current digital-to-analog conversion circuit 32 has a current source ISn, NMOS transistors MNs, MNd, and MN0 to MNn (n at the end of MNn is indicative of an integer and is the same value as that of the number of bits in the setting value output by the selector 29), and switches SWn00 to SWn0$n$, and SWn10 to SWn1$n$ (n at the end of SWn0$n$ and SWn1$n$ is indicative of an integer and is the same value as that of the number of bits in the setting value output by the selector 29).

The current digital-to-analog conversion circuit 32 has a current mirror circuit in which the NMOS transistor MNs serves as a source side transistor and in which the NMOS transistors MNd and MN0 to MNn serve as branch side transistors. For the NMOS transistors MNs, MNd, and MN0 to MNn, a source is connected to the ground wire. A drain of the NMOS transistor MNs is provided with a reference current from the current source ISn. The gates of the NMOS transistors MNs and MNd are connected together. Furthermore, the drain of the NMOS transistor MNs is connected to the gate of the NMOS transistor MNs and to the gate of the NMOS transistor MNd. The switches SWn00 to SWn0$n$ are provided between the ground wire and the gates of the respective NMOS transistors MN0 to MNn. Furthermore, the switches SWN10 to SWN1$n$ are provided between the gate of the NMOS transistor MNs and the gates of the NMOS transistors MN0 to MNn. The switches SWn00 to SWn0n and the switches SWn10 to SWn1n each have its open and close state controlled in accordance with the value of a corresponding bit in the setting value output by the selector 29. Additionally, the switches SWn00 to SWn0n and the switches SWn10 to SWn1n are controlled such that the open and close states of the switches are exclusive based on the value of the corresponding bit in the setting value output by the selector 29. In other words, the current digital-to-analog conversion circuit 32 is controlled such that the number of branch side transistors in the current mirror circuit that output currents is set to any one of the values between 1 and n+1 according to a setting value output by the selector 29, to enable the current value of the output current to be switched in $2^n$ steps.

The waveform switching circuit 33 determines, in a switching manner, whether to provide the integration circuit 34 with the offset current output by the offset current source 31 or the output current output by the current digital-to-analog conversion circuit 32. The waveform switching circuit 33 has switches SW3 and SW4. The switch SW3 determines, in a switching manner, whether to pass the offset current to the integration circuit 34 side or to a terminal to which a reference voltage VREF is input. The switch SW4 determines, in a switching manner, whether to pass the output current to the integration circuit 34 side or to a terminal to which the reference voltage VREF is input. The switch SW3 switches a path using the offset application period pulse OSP. The switch SW4 switches a path using the sweep period pulse SWP. The reference voltage VREF is provided by the reference voltage generating circuit 14. Additionally, the offset application period pulse OSP and the sweep period pulse SWP are provided by the control signal generating circuit 15.

The integration circuit 34 integrates output currents to output the ramp signal S1. Furthermore, upon receiving the offset current, the integration circuit 34 integrates the offset current to set the voltage level of the ramp signal S1 to an offset level. The ramp signal output by the integration circuit 34 is provided to the analog-to-digital converter 11 via the buffer circuit 35.

The integration circuit 34 has an amplifier OP1, a capacitor C5, and a switch SW5. The reference voltage VREF is input to a non-inverted input terminal of the amplifier OP1. The offset current or the output current is input to a non-inverted input terminal of the amplifier OP1 via the waveform switching circuit 33. The capacitor C5 and the switch SW5 are connected in parallel between an inverted input terminal and an output terminal of the amplifier OP1. The integration circuit 34 changes the voltage of the output ramp signal S1 based on the integral value of the output current or the offset current, using the reference voltage VREF as a reference voltage. The switch SW5 has its open and close state controlled based on the integration amplifier autozero pulse ZP output by the control signal generating circuit 15.

Description of Operation of Ramp Signal Generating Circuit

Figure 8:
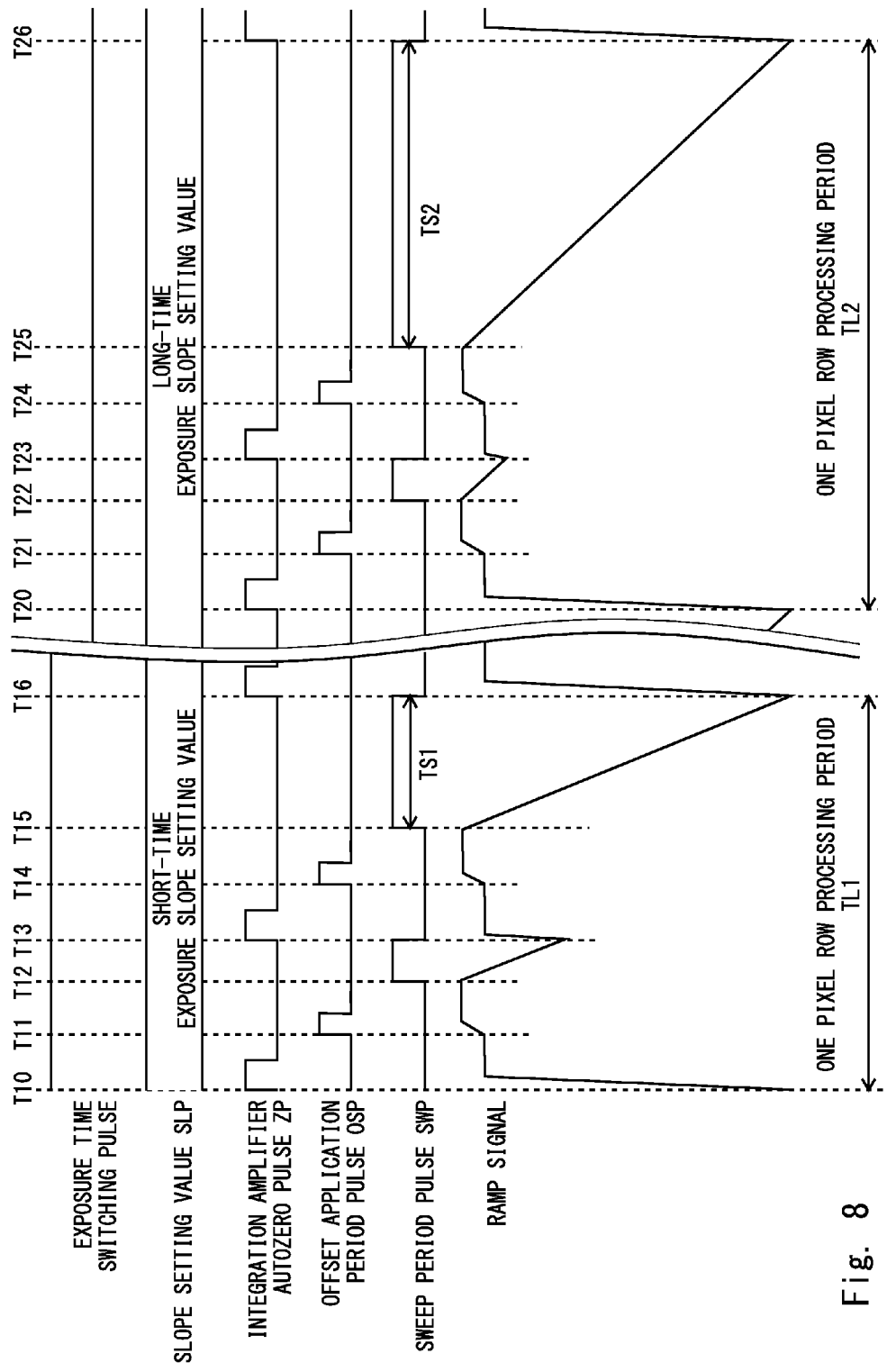
FIG. 8 is a timing chart showing an operation of a ramp signal generating circuit according to the first embodiment.

Subsequently, operations of the ramp signal generating circuit according to the first embodiment will be described. FIG. 8 depicts a timing chart showing operations of the ramp signal generating circuit according to the first embodiment. As depicted in FIG. 8, in the ramp signal generating circuit 13 according to the first embodiment, when the exposure time switching pulse indicates the short-time exposure period (e.g., when the logical level is a high level), the ramp waveform control circuit 20 supplies the short-time exposure slope setting value stored in the short-time exposure slope setting unit 21 to the ramp waveform generating circuit 30 as the slope setting value SLP. On the other hand, in the ramp signal generating circuit 13 according to the first embodiment, when the exposure time switching pulse indicates the long-time exposure period (e.g., when the logical level is a low level), the ramp waveform control circuit 20 supplies the long-time exposure slope setting value stored in the long-time exposure slope setting unit 22 to the ramp waveform generating circuit 30 as the slope setting value SLP.

Then, when the integration amplifier autozero pulse ZP is shifted to a high level (timings T10, T13, T20, and T23), the ramp waveform generating circuit 30 resets the output from the integration circuit 34. When the offset application period pulse OSP is shifted to a high level (timings T11, 114, T21, and T24), the ramp waveform generating circuit 30 sets the output from the integration circuit 34 to a reference voltage level. The ramp waveform generating circuit 30 sweeps the ramp signal S1 in the periods when the logical level of the sweep period pulse SWP is at a high level (from T12 to T13, from T15 to T16, from T22 to T23, and from T25 to T26). In the example depicted in FIG. 8, there are two types of periods in which the sweep period pulse SWP is shifted to a high level. In the period from the timings T12 to T13 and the timings T22 to T23 in which the sweep period pulse SWP is shifted to a high level, the analog-to-digital converter 11 evaluates the level of the reference voltage output by the ramp waveform generating circuit 30, and analog-to-digital converter 11 does not perform an analog-to-digital converting process on the pixel signal. On the other hand, in the periods from the timing T15 to T16 and timings T25 to T26 in which the sweep period pulse SWP is shifted to a high level, the analog-to-digital converter 11 performs the analog-to-digital converting process on the pixel signal.

As shown in FIG. 8, the control signal generating circuit 15 sets a sweep time (TS1 in FIG. 8) that is specified by the sweep period pulse SWP output in the period indicated by the exposure time switching pulse as being the short-time exposure period in such a way that TS1 will become shorter than a sweep time (TS2 in FIG. 8) specified by the sweep period pulse SWP output in the period indicated by the exposure time switching pulse as being the long-time exposure period. By doing so, in a period in which the ramp signal generating circuit 13 outputs the ramp signal for one pixel row, one pixel row processing period TL1 in the short-time exposure period will become shorter than one pixel row processing period TL2 in the long-time exposure period.

Description of Image Acquisition Operation Performed by Image Sensor

Figure 9:
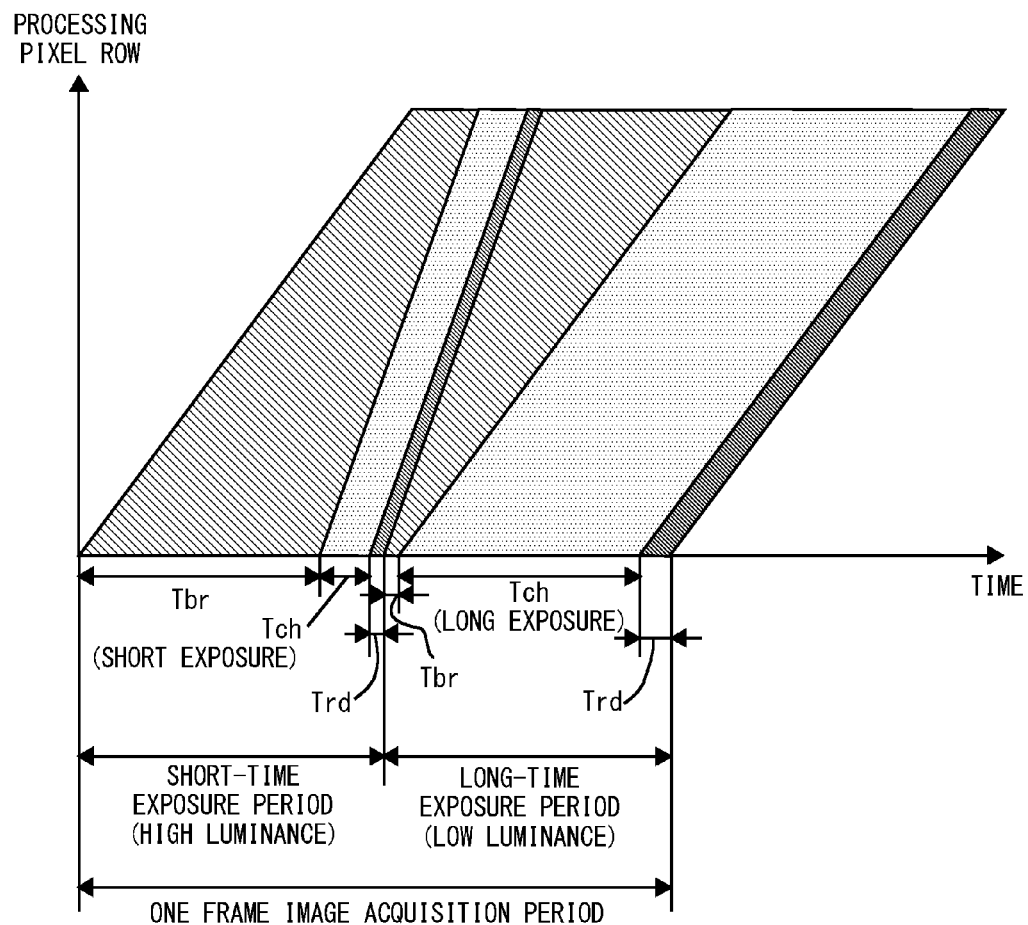
FIG. 9 is a timing chart showing acquisition of pixel signals in the semiconductor device according to the first embodiment.

Next, an operation when the image sensor 1 according to the first embodiment acquires pixel signals will be described. FIG. 9 depicts a timing chart showing acquisition of pixel signals in the image sensor 1 according to the first embodiment. As depicted in FIG. 9, in the image sensor 1 according to the first embodiment, an image for one frame is acquired through three operation periods, a blanking period Tbr, an exposure period Tch, and a read period Trd. The blanking period Tbr is a period used to adjust the length of the exposure period Tch and to reset the charge in pixels. The exposure period Tch is a period when the pixels are actually exposed to incident light and when charge according to the amount of the incident light is accumulated in the pixels. The read period Trd is a period when pixel signals indicating the amount of charge accumulated in the pixels are read out to the analog-to-digital converter 11. During the read period Trd, the analog-to-digital converter 11 converts the pixel signals that are analog signals into image information that is digital values. Furthermore, as depicted in FIG. 9, the image sensor 1 uses a rolling shutter scheme in which sequential processing is executed on pixel rows, and thus, for example, processing on rows far from the analog-to-digital converter 11 is executed at a later timing than processing on rows close to the analog-to-digital converter 11. Consequently, when the axis of ordinate represents a pixel row to be processed and the axis of abscissas represents time, then in a timing chart, each period is expressed by a rhombic shape formed of processing timings.

Further, in the image sensor 1 according to the first embodiment, the read period Trd in the short-time exposure period in which an image of a high luminance part is clearly acquired is shorter than the read period Trd in the long-time exposure period in which an image of a low luminance part is clearly acquired. This is because the sweep period in which the ramp signal generating circuit 13 and the control signal generating circuit 15 sweep the ramp signal S1 differs between the short-time exposure period and the long-time exposure period and because the number of bits in the digital value output by the analog-to-digital converter 11 differs between the short-time exposure period and the long-time exposure period. With such differences, in the image sensor 1 according to the first embodiment, a period in the short-time exposure period from when reading of the first pixel row is started until reading of the last pixel row is completed becomes shorter than a period in the long-time exposure period from when reading of the first pixel row is started until reading of the last pixel row is completed. Thus, in the example depicted in FIG. 9, a slope of the rhombic shape indicating the read period in the short-time exposure period is steeper than that in the long-time exposure period.

Description of Synthesizing Method of Image Data

Figure 10:
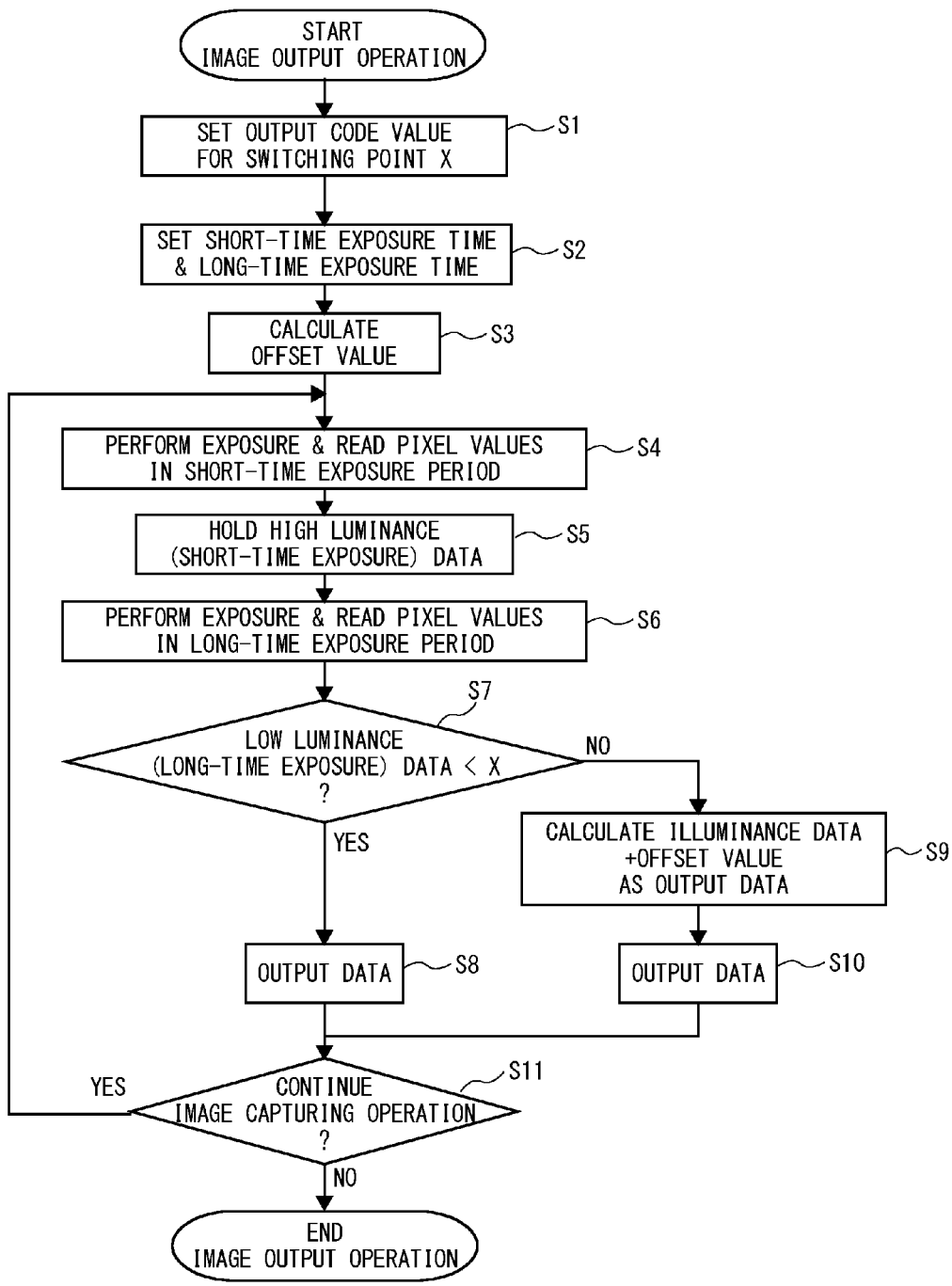
FIG. 10 is a flowchart for explaining a process for synthesizing digital values in the semiconductor device according to the first embodiment.

Next, a method for synthesizing images acquired using the image sensor 1 according to the first embodiment will be described. As described above, when an image is acquired using the image sensor 1 according to the first embodiment, two pieces of data are acquired; data of an image that has a clear part in the high luminance side (e.g., a first digital value): and data of an image that has a clear part in the low luminance side (e.g., a second digital value). The number of bits in the value representing a pixel differs between in the data of the image that has a clear part in the high luminance side and in the data of the image that has a clear part in the low luminance side. Thus, a certain operation is required to synthesize these two images. In a semiconductor device that outputs images using the image sensor 1 according to the first embodiment (the semiconductor device will be hereinafter referred to as merely a semiconductor device), data of a pixel having a code greater than or equal to a switching point X in the second digital value is replaced by image data in the first digital value. FIG. 10 depicts a flowchart for explaining a process for synthesizing digital values in the semiconductor device according to the first embodiment.

As depicted in FIG. 10, the semiconductor device according to the first embodiment sets the switching point X indicative of an output code for switching the two pieces of image data to be output (step S1). This switching point X may be set for each value of the slopes of the ramp signal S1 in the short-time exposure period and the long-time exposure period. The switching point X that has been set before can be repeatedly used for the same slope of the ramp signal S1.

Next, the semiconductor device according to the first embodiment sets a length of the short-time exposure period and a length of the long-time exposure period (step S2). As a range of sweep for the ramp signal S1 (a range of fluctuation for the voltage level of the ramp signal) is previously determined, the slope of the ramp signal S1 can be determined when the length of the exposure period is set. Next, the semiconductor device according to the first embodiment calculates an offset value which will be added to the first digital value in order to output image data to be acquired in the short-time exposure period (step S3).

After that, the semiconductor device according to the first embodiment performs exposure and reads pixel values in the short-time exposure period (step S4) and holds the generated first digital value (high luminance data) (step S5). Next, the semiconductor device according to the first embodiment performs exposure and reads pixel values in the long-time exposure period and holds the generated second digital value (low luminance data) (step S6).

Then, when the output code of the low luminance data is lower than the switching point X, the semiconductor device according to the first embodiment outputs the low illuminance data output by the analog-to-digital converter 11 as it is (steps S7 and S8). On the other hand, when the output code of the low luminance data is greater than or equal to the switching point X, the semiconductor device according to the first embodiment adds the offset value to the high luminance data and outputs the resultant data in place of the low illuminance data output by the analog-to-digital converter 11 (steps S7 to S10). The semiconductor device according to the first embodiment repeats the processes from the steps S4 to S10 until it receives an instruction for completing an imaging operation (step S11).

Figure 11:
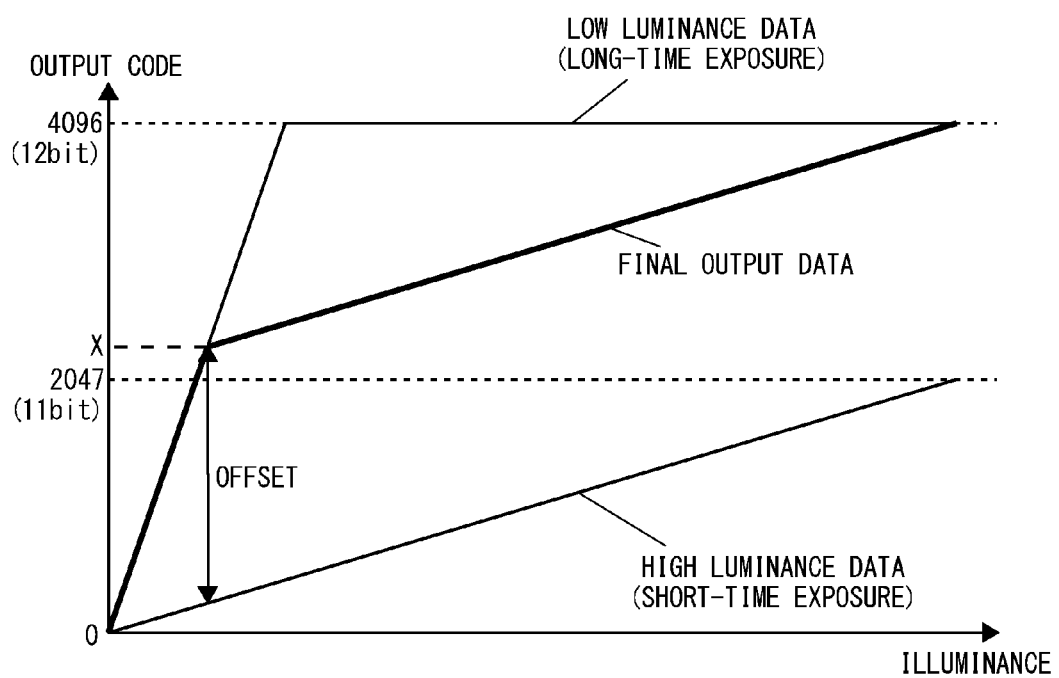
FIG. 11 is a graph for explaining the process for synthesizing digital values in the semiconductor device according to the first embodiment.

The output code of the output data that is output by the synthesizing method described by referring to FIG. 10 will be described below. FIG. 11 depicts a graph for explaining a method for synthesizing digital values in the semiconductor device according to the first embodiment. As depicted in FIG. 11, in the semiconductor device according to the first embodiment, the high luminance data resulting from the short-time exposure has a resolution of eleven bits, while the low luminance data resulting from the long-time exposure has a resolution of twelve bits. The semiconductor device according to the first embodiment uses the low luminance data as low illuminance data, and when the low luminance data is greater than or equal to the switching point X, the data obtained by adding the offset value to the high luminance data is used for the part corresponding to the data that is greater than or equal to the switching point X.

As an example of a method for calculating the switching point X, an intersection between a straight line where the output code is in the range from 2048 to 4096 and that is shifted from the straight line for the high luminance data and a straight line for the low luminance data may be calculated as the switching point X. Moreover, as an example of method for calculating the offset value, a difference between the output code of the high luminance data having the same illuminance as that of the low luminance data corresponding to the switching point X and the output code of the low luminance data corresponding to the switching point X may be calculated as the offset value.

Description of Implementation of Semiconductor Device

In the semiconductor device according to the first embodiment, a data holding unit holds the first digital value (e.g., the high luminance data) and the second digital value (e.g., the low luminance data), and a data operation unit performs image synthesis by adding the offset value to the first digital value (e.g., the high luminance data) and outputting output data. The data holding unit and the data operation unit may either be included in the image sensor or provided on another semiconductor chip. An implementation of the semiconductor device including the image sensor 1 will be described below. FIG. 12 depicts a drawing for explaining the implementation of the semiconductor device.

In a first implementation depicted in FIG. 12, the image sensor 1 includes the pixel area 10, the analog-to-digital converter 11 (the PGA unit and the AD converter), the data holding unit, and the data operation unit. The image sensor 1 outputs final output data to a signal processing circuit. In a second implementation, the image sensor 1 includes the pixel area 10, the analog-to-digital converter 11, and the data holding unit. The data operation unit is provided in the signal processing circuit. In the second implementation, the data operation unit reads the first and the second digital values that are stored in the data holding unit as data D2. In a third implementation, the image sensor 1 includes the pixel area 10 and the analog-to-digital converter 11. The data holding unit and the data operation unit are provided in the signal processing circuit. In the third implementation, the first and second digital values generated by the analog-to-digital converter 11 are output to the data holding unit as data D1.

Description of Advantage of Image Sensor

As described above, in the image sensor 1 according to the first embodiment, an amount of data (e.g., the number of bits) in the high luminance data is set in such a way that it will be lower than that of the low luminance data in order to reduce a time for reading the high luminance data in which a high luminance part is clear so that it will be shorter than a time for reading the low luminance data. Then, the image sensor 1 according to the first embodiment can reduce a data acquisition time for generating a High Dynamic Range (HDR) synthesized image that requires data for a plurality of images including high clarity and different luminance from each other. Further, the image sensor 1 according to the first embodiment can increase a frame rate by reducing the data acquisition time.

In addition, as the image sensor 1 according to the first embodiment can reduce the amount of data to be generated, a capacity of the data holding unit can be reduced. Moreover, as the image sensor 1 according to the first embodiment can synthesize a plurality of pieces of image data including clear parts that differ among the respective pieces of image data by replacing the data, the amount of operation for synthesizing data can be reduced.

The image sensor 1 according to the first embodiment can generate image data in a higher dynamic range than image data acquired in one exposure by separately acquiring the low and high luminance data and then synthesizing the low and high luminance data. With the image sensor 1 according to the first embodiment, as the period for the short-time exposure can be shortened even in a fixed frame rate, the period for the long-time exposure is increased to generate image data in which the low luminance part can be recognized more clearly.

The image sensor 1 according to the first embodiment can set the slope setting value for the ramp signal by the setting value stored in the register. Thus, the image sensor 1 according to the first embodiment can improve quality of image data irrespective of variations in the semiconductor elements that are caused by process variation in semiconductor fabrication. As the slope setting value for the ramp signal can be set by the setting value stored in the register, the image sensor 1 according to the first embodiment can ensure high reproducibility, scalability, and versatility.

Furthermore, the image sensor 1 according to the first embodiment can reduce phase shift among pixel rows at the time of short-time exposure by reducing the read time for the short-time exposure. The reduction in the phase shift enables the image sensor 1 according to the first embodiment to reduce flickers that are fluctuations in the luminance among rows in a frame. An advantage of reducing the flickers will be described in more detail below.

Description of Flicker Phenomenon

A flicker phenomenon will be a problem when a subject is captured under a light source that uses a commercial AC power supply of fluorescent light by an imaging method that employs the rolling shutter scheme. The flicker phenomenon includes flickers in which horizontal stripes are generated due to fluctuations in luminance among the pixel rows in one frame (hereinafter referred to as line flickers) and flickers in which luminance of the entire frame is fluctuated due to fluctuations in luminance among frames (hereinafter referred to as surface flickers). The image sensor 1 according to the first embodiment is especially effective for the line flickers.

The surface flickers can be corrected by acquiring a temporal transition of average values for the pixel signals between frames, detecting a frequency component of fluctuations in the average values between the frames, and performing correction process based on a reverse phase component of the detected frequency component. The amount of operation required for this process is comparatively small, and thus the surface flicker can be easily corrected. On the other hand, high computational capability is required for the correction process of the line flickers because a frequency component of the fluctuations in luminance in one frame needs to be detected to perform the correction process. However, the image sensor 1 according to the first embodiment can reduce the line flickers without performing the correction process.

The commercial AC power supply is AC signals including a frequency of 50 Hz or 60 Hz. Lighting equipment and the like are lighted with a power supply that is obtained by converting a full-wave rectified commercial AC power supply into a DC power supply. Therefore, such light equipment blinks at a cycle twice as great as the cycle of the commercial power supply signal. For example, lighting equipment operating with a commercial AC power supply at 50 Hz repeatedly blinks at a cycle of 100 Hz (10 msec), while lighting equipment operating with a commercial AC power supply at 60 Hz repeatedly blinks at a cycle of 120 Hz (8.3 msec).

Figure 13:
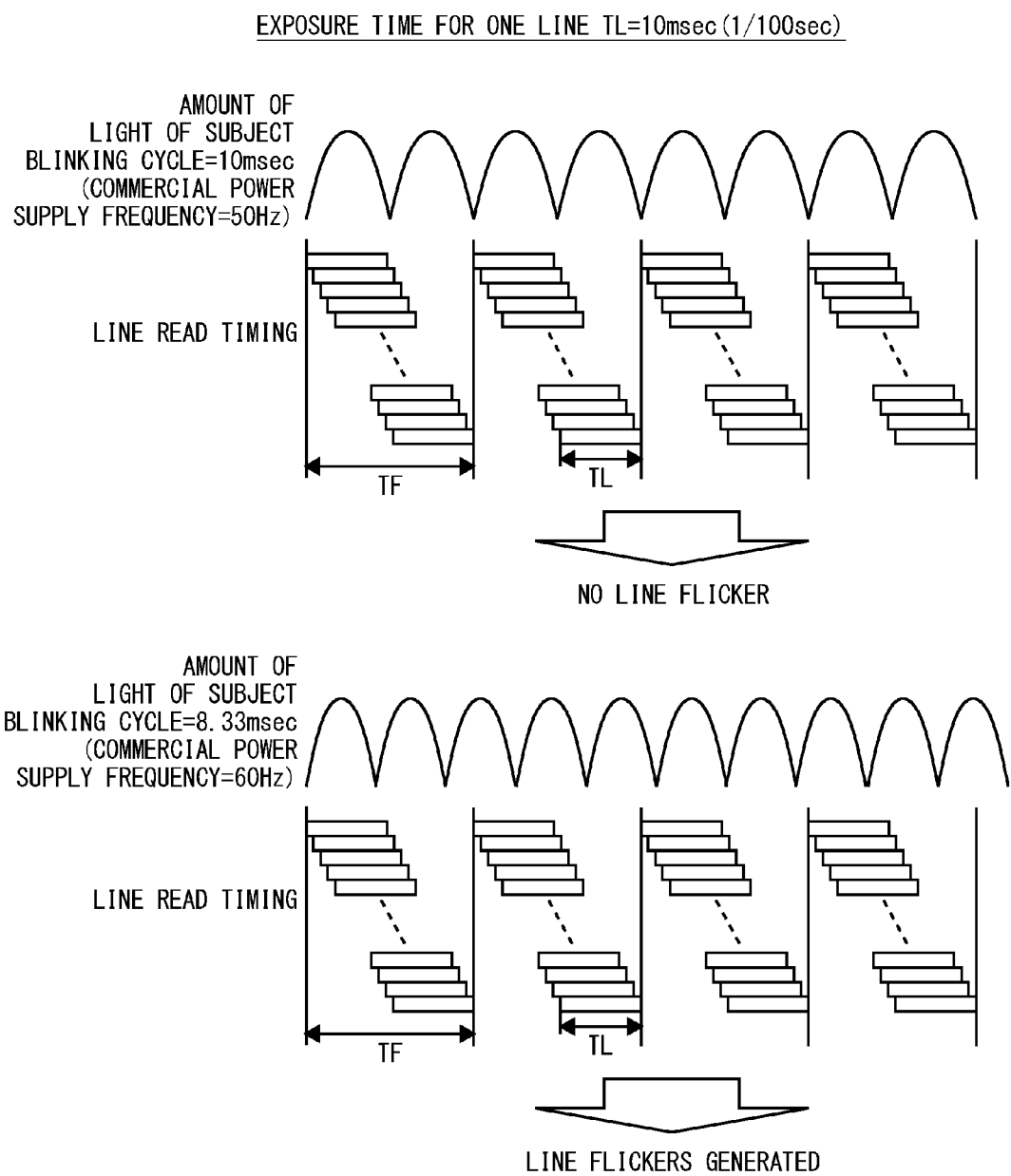
FIG. 13 is a drawing for explaining line flickers in image data.

A cause for the line flickers when such blinking occurs will be described below. FIGS. 13 and 14 depict drawings for explaining line flickers in image data. In FIG. 13, an exposure time TL for one line is 10 msec, while an exposure time TF for one frame is 20 msec. Note that in FIG. 13, although the exposure time TF for one frame is twice as great as the exposure time TL for one line to make a description easy to understand, the exposure time TF for one frame may be greater or smaller than twice as great as the exposure time TL for one line. As depicted in FIG. 13, for a blinking cycle of 10 msec, when the exposure time TL for one line is set to 10 msec, all lines can be exposed in one cycle of the blinking cycle. Thus, fluctuations in the luminance among lines that are caused by the blinking cycle will not be generated. Accordingly, it is possible to prevent the line flickers from being generated by setting the exposure time TL for one line to 10 msec when the blinking cycle is 10 msec. On the other hand, for the blinking cycle of 10 msec, when the exposure time TL for one line is set to 8.3 msec, fluctuations in luminance among lines that are caused by the blinking cycle are generated because the amount of light received differs from line to line. Accordingly, the line flickers are generated by setting the exposure time TL for one line to 10 msec when the blinking cycle is 10 msec.

In FIG. 14, the exposure time TL for one line is 8.3 msec, while the exposure time TF for one frame is 16.6 msec. Note that in FIG. 14, although the exposure time TF for one frame is twice as great as the exposure time TL for one line to make a description easy to understand, the exposure time TF for one frame may be greater or smaller than twice as great as the exposure time TL for one line. As depicted in FIG. 14, for a blinking cycle of 8.3 msec, when the exposure time TL for one line is set to 10 msec, an amount of received light differs among lines. Thus, fluctuations in the luminance among lines that are caused by the blinking cycle will be generated. Accordingly, the line flickers are generated by setting the exposure time TL for one line to 10 msec when the blinking cycle is 8.3 msec. On the other hand, for a blinking cycle of 8.3 msec, when the exposure time TL for one line is set to 8.3 msec, all lines can be exposed in one cycle of the blinking cycle. Thus, fluctuations in the luminance among lines that are caused by the blinking cycle will not be generated. Accordingly, it is possible to prevent the line flickers from being generated by setting the exposure time TL for one line to 8.3 msec when the blinking cycle is 8.3 msec.

As described so far, flickers can be prevented from being generated by setting the exposure time to an integral multiple of the blinking cycle. A relationship between the fluctuations in the luminance among lines and the exposure time will be described in more detail below. FIG. 15 depicts a graph for explaining a relationship between pixel rows in image data and fluctuations in an amount of received light. In the graph of FIG. 15, the axis of ordinate represents an order of the pixel rows (pixel lines), and the axis of abscissa represents an amount of exposure E. In the graph of FIG. 15, the number of pixel rows is assumed to be 1024, and the frame rate is assumed to be 60 fps. The amount of E is expressed by the expression (1).

[Expression 1]

$$E = \int_{tstart}^{tend} |\sin(2\pi ft)| dt \quad (1)$$

Note that in FIG. 1, tstart is an exposure start time, tend is an exposure end time, and f is a frequency of the commercial AC power supply. Although the amount of exposure E is a definite integral of an absolute value for a sine wave, an indefinite integral of the absolute value for the sine wave uses a period between 0 to (½ f) as a unit, and ½ f and greater will become an increasing function that is continuous connected under a boundary condition. With this indefinite integral, a difference between integrated values at a time determined in an integration section (a section between tstart and tend) is calculated as the amount of exposure E. As tstart and tend differ among the pixel rows, differences of tstart and tend among the pixel rows will become a difference in the amount of exposure. Further, differences in the amount of exposure among the lines will become the line flickers.

As can be seen in FIG. 15, when a power supply frequency is 50 Hz, at the exposure time of ten msec, there is no difference in the amount of exposure among the lines. When the power supply frequency is 60 Hz, at the exposure time between nine msec and eight msec, there is no difference in the amount of exposure among the lines. More specifically, when the power supply frequency is 60 Hz, at the exposure time of 8.3 msec, there is no difference in the amount of exposure among the lines. As depicted in FIG. 15, the greater the amount of exposure E, the greater the range of fluctuation in the amount of exposure becomes. That is, the line flicker will become more distinct for images with higher luminance.

FIG. 16 depicts another graph for explaining a relationship between pixel rows in image data and fluctuations in the amount of exposure. A difference in the fluctuations in the amount of exposure E caused by different frame rates will be described with reference to FIG. 16. Note that FIG. 16 shows different frame rates for a fixed power supply frequency at 50 Hz. As depicted in FIG. 16, the higher the frame rate, the longer a cycle of the fluctuations in the amount of exposure in one frame becomes. This is because, with a higher frame rate, phase shift among the lines will become small. With a long cycle of the fluctuations in one frame, the number of the line flickers generated in one frame is reduced, and thus the line flickers in the frame will become less noticeable.

Description of Advantage of Reducing Flicker Phenomenon

As described above, the line flickers tend to be distinct when the luminance is high and the frame rate is low. The image sensor 1 according to the first embodiment can shorten the read period for reading the pixel signals in order to acquire high luminance data. In other words, the image sensor 1 according to the first embodiment can acquire high luminance data at a high frame rate. It is thus possible for the image sensor 1 according to the first embodiment to reduce the line flickers. Further, as the image sensor 1 according to the first embodiment does not need an operation process for reducing the line flickers in particular, the image sensor 1 according to the first embodiment can prevent the line flickers from being generated even while capturing a video in which images are continuously acquired.

Second Embodiment

Figure 17:
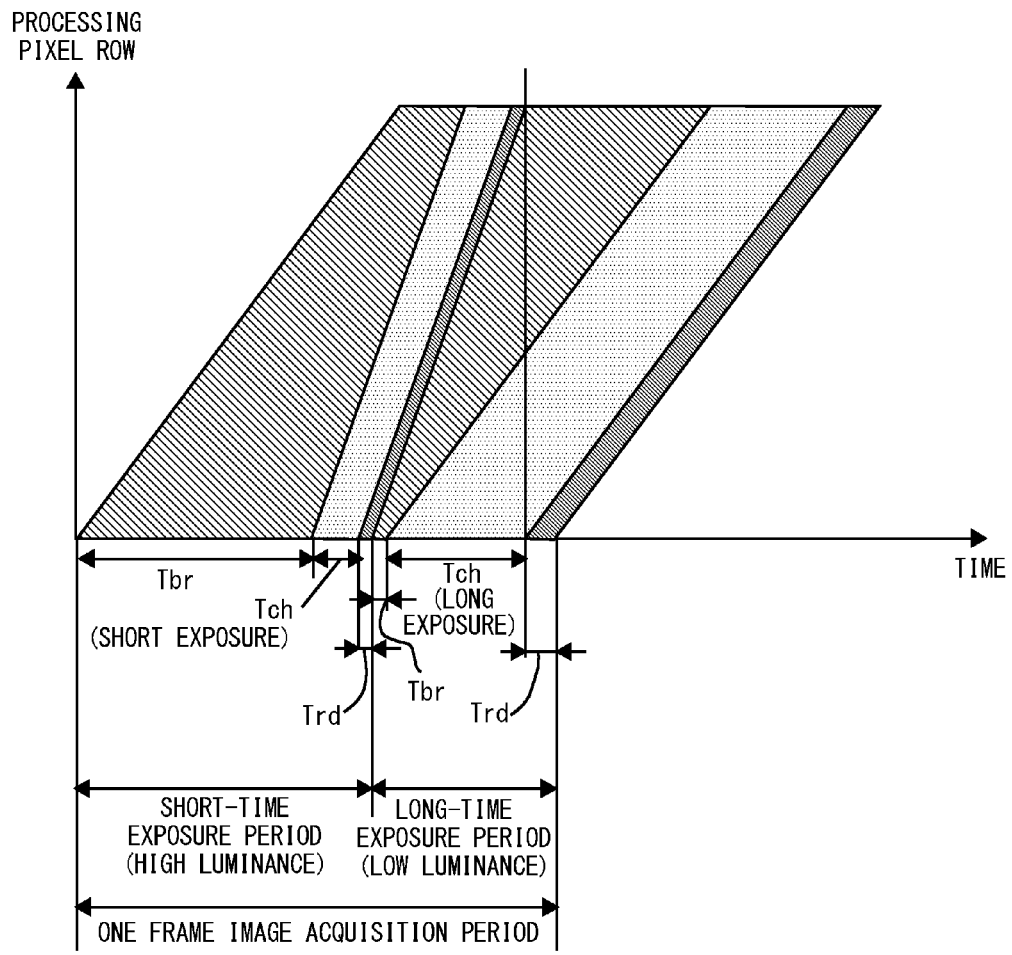
FIG. 17 is a timing chart showing acquisition of pixel signals in a semiconductor device according to a second embodiment.

Another example of a timing for reading pixel signals will be described in a second embodiment. FIG. 17 depicts a timing chart showing acquisition of pixel signals in a semiconductor device according to the second embodiment.

As depicted in FIG. 17, in response to a completion of generation of a digital value corresponding to one exposure period in the analog-to-digital converter 11, the semiconductor device according to the second embodiment starts generating a digital value corresponding to another exposure period. To be more specific, the semiconductor device according to the second embodiment reads the pixel signals corresponding to the long-time exposure immediately after the analog-to-digital converter 11 completes reading the pixel signals corresponding to the short-time exposure. For example, the control signal generating circuit 15 in the control unit 12 supplies an instruction to the pixel area 10 and the ramp signal generating circuit 13 in order to control the read timing.

As described above, the frame rate can be further increased by incorporating the read timing for the pixel signals according to the second embodiment. For example, when a time taken for reading the pixel signals acquired in the short-time exposure for all pixel rows is reduced to ¼ of the short-time exposure period, the remaining ¾ of the short-time exposure period will become a period not used to read the pixel signals. The semiconductor device according to the second embodiment can shorten the period not used to read the pixel signals. Although two frame periods are required to perform exposure twice, with the semiconductor device according to the second embodiment, only 1.25 frame periods are required to perform exposure twice. In this case, the frame rate can be increased to 2/1.25=1.6 (times).

Third Embodiment

In a third embodiment, an operation of the image sensor 1 when the number of the exposure periods is increased to three will be described. Note that when the number of the exposure periods is increased to three, the ramp waveform control circuit 20 holds a middle-time exposure slope setting value in addition to the short-time exposure slope setting value and the long-time exposure slope setting value and switches a slope setting value to be output according to a length of the exposure time.

Figure 18:
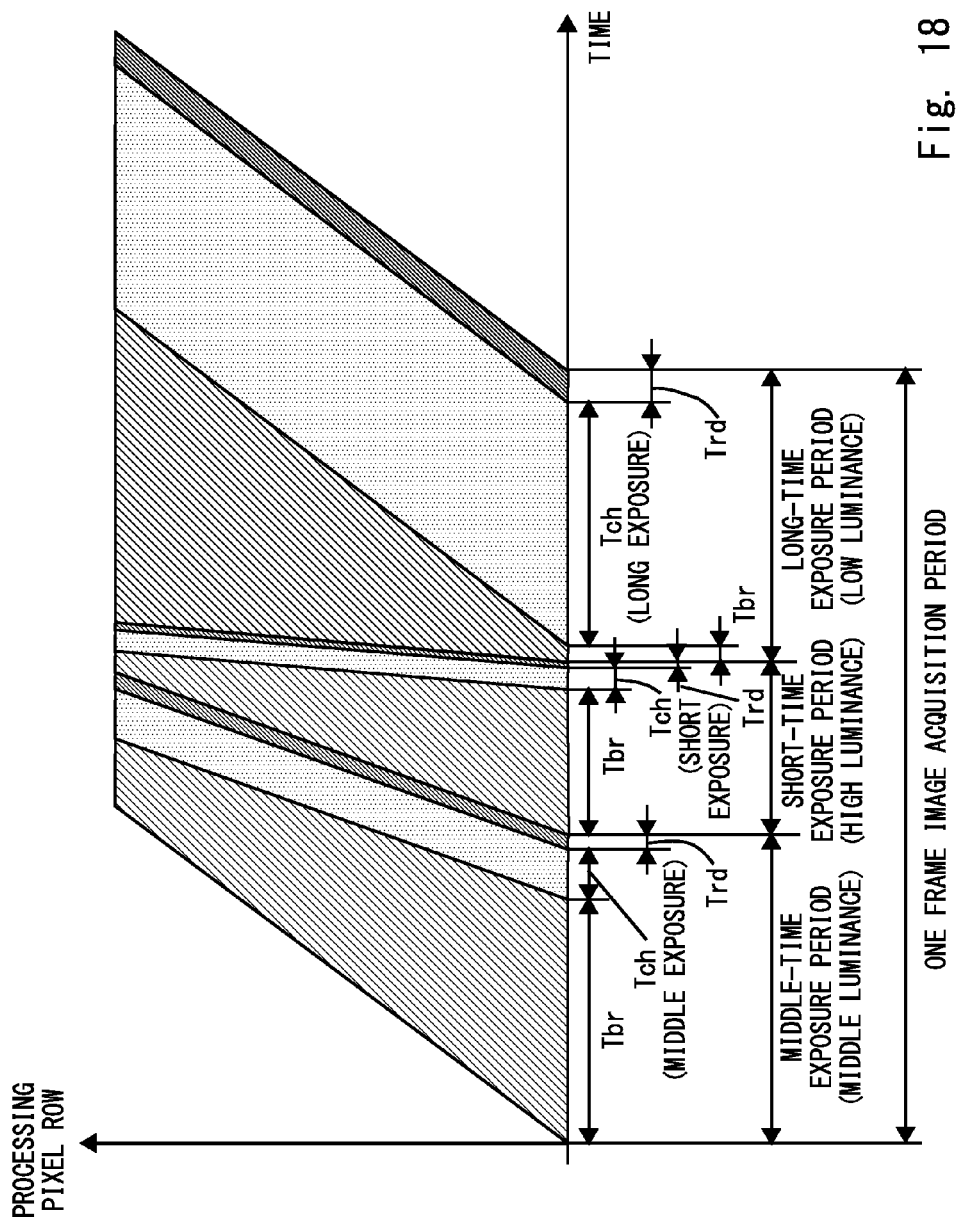
FIG. 18 is a timing chart showing acquisition of pixel signals in a semiconductor device according to a third embodiment.

FIG. 18 depicts a timing chart showing acquisition of pixel signals in a semiconductor device according to the third embodiment. As depicted in FIG. 18, the semiconductor device according to the third embodiment further includes a middle-time exposure period before the short-time exposure period in addition to the exposure periods in the semiconductor device according to the first embodiment. Further, the read period Trd becomes longer in order of the short-time exposure period, the middle-time exposure period, and the long-time exposure period. That is, in the semiconductor device according to the third embodiment, the number of bits in the digital value generated by the analog-to-digital converter 11 increases in order of the short-time exposure period, the middle-term exposure period, and the long-time exposure period.

In this way, by performing exposure three times, the semiconductor device according to the third embodiment can acquire an image with a dynamic range wider than in the first embodiment. Even when the exposure is performed three times in the manner described above, it is possible to avoid the time for acquiring an image for one frame from being extended by reducing at least one of the read time in the middle-time exposure and the read time in the short-time exposure (or by reducing the number of bits in the digital value output by the analog-to-digital converter 11). Note that the number of bits in the digital value output by the analog-to-digital converter 11 can be changed according to a specification of the semiconductor device, for example, the number of bits is made to be the same in the digital values corresponding to the middle-time exposure and the long-time exposure.

Fourth Embodiment

In a fourth embodiment, an example in which the slope of the ramp signal S1 is changed at least once during one sweep period of the ramp signal S1 will be described. That is, in a semiconductor device according to the fourth embodiment, the analog-to-digital converter 11 reads the pixel signals from each row for the light-receiving elements arranged in a matrix in the pixel area 10 and performs a converting process on the pixel signals. Further, the ramp signal generating circuit 13 sweeps the ramp signal S1 for each row and changes the slope of the ramp signal S1 at least once in one sweep period. In order to perform the above operation, the semiconductor device according to the fourth embodiment uses a ramp waveform control circuit 20a in place of the ramp waveform control circuit 20. The ramp waveform control circuit 20a includes two or more slope setting values indicating two or more different slopes as the short-time exposure slope setting values and includes two or more slope setting values indicating two or more different slopes as the long-time exposure slope setting values. An average slope value of the plurality of slope setting values included in the long-time exposure slope setting values stored in the ramp waveform control circuit 20a is set to be a value smaller than an average slope value of the plurality of slope setting values included in the short-time exposure slope setting values stored in the ramp waveform control circuit 20a.

Figure 19:
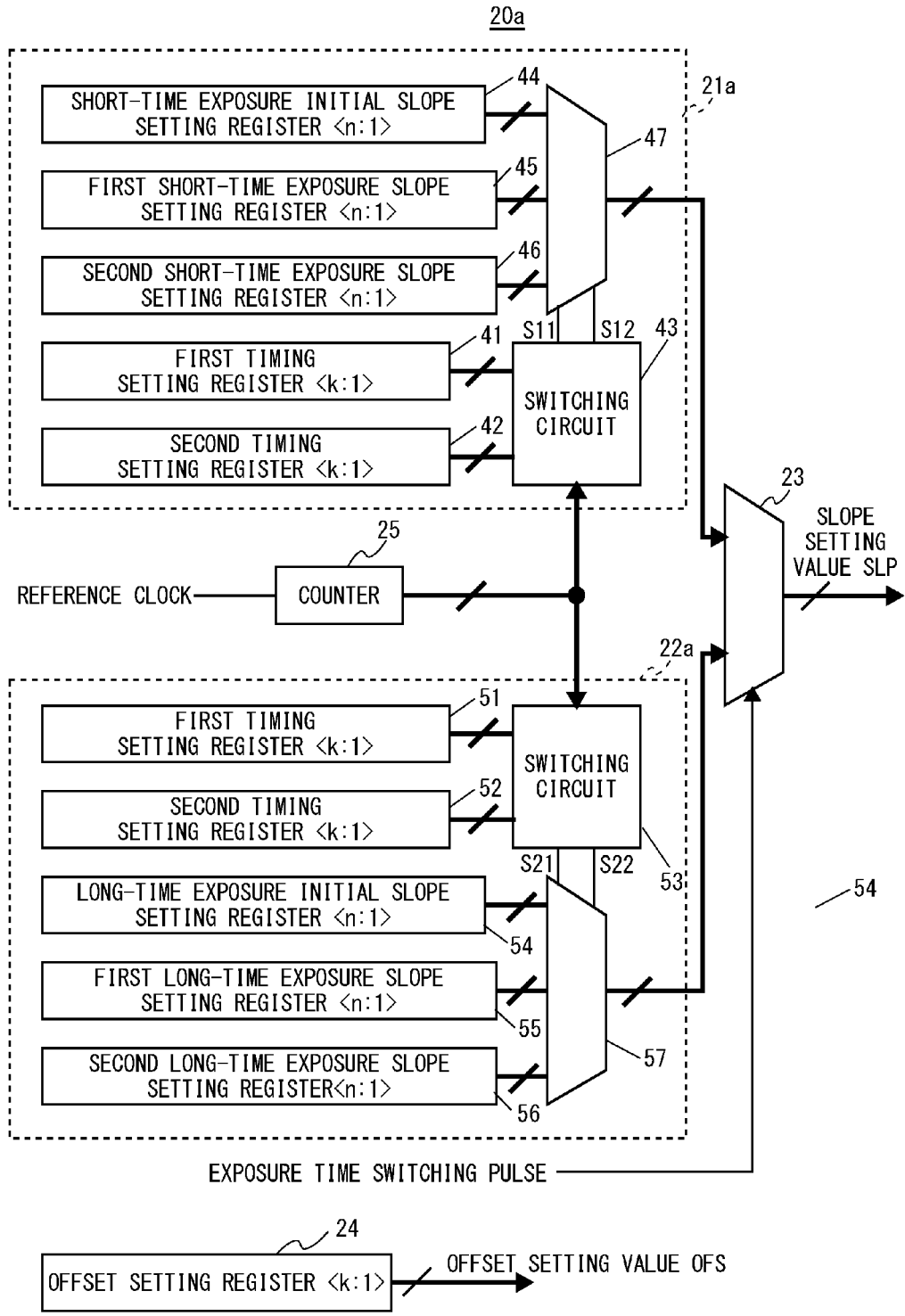
FIG. 19 is a block diagram of a ramp waveform control circuit of a semiconductor device according to a fourth embodiment.

FIG. 19 depicts a block diagram of the ramp waveform control circuit of the semiconductor device according to the fourth embodiment. As depicted in FIG. 19, the ramp waveform control circuit 20a includes a short-time exposure slope setting unit 21a, a long-time exposure slope setting unit 22a, a selector 23, an offset setting register 24, and a counter 25. The short-time exposure slope setting unit 21a stores three short-time exposure slope setting values and determines, in a switching manner, the exposure time slope setting value to be output when a time from when the sweeping of the ramp signal S1 has started reached a predetermined time. Likewise, the long-time exposure slope setting unit 22a stores three long-time exposure slope setting values and determines, in a switching manner, the exposure time slope setting value to be output when a time from when the sweeping of the ramp signal S1 has started reached a predetermined time.

The short-time exposure slope setting unit 21a includes a first timing setting register 41, a second timing setting register 42, a switching circuit 43, a short-time exposure initial slope setting register 44, a first short-time exposure slope setting register 45, a second short-time exposure slope setting register 46, and a selector 47.

The first timing setting register 41 stores a first timing setting value. The first timing setting value specifies a timing to switch the slope of the ramp signal S1 from a short-time exposure initial slope setting value stored in the short-time exposure initial slope setting register 44 to the first short-time exposure slope setting value stored in a first short-time exposure slope setting register 45. The second timing setting register 42 stores a second timing setting value. The second timing setting value specifies a timing to switch the slope of the ramp signal S1 from the first short-time exposure slope setting value stored in the first short-time exposure slope setting register 45 to a second short-time exposure slope setting value stored in the second short-time exposure slope setting register 46.

The switching circuit 43 compares a count value generated by the counter 25 in an operation for counting the reference clocks, the first timing setting value, and the second timing setting value. Then, the switching circuit 43 switches a slope setting value output by the selector 47 according to a result of the comparison.

The long-time exposure slope setting unit 22a includes a first timing setting register 51, a second timing setting register 52, a switching circuit 53, a long-time exposure initial slope setting register 54, a first long-time exposure slope setting register 55, a second long-time exposure slope setting register 56, and a selector 57.

The first timing setting register 51 stores a first timing setting value. The first timing setting value specifies a timing to switch the slope of the ramp signal S1 from a long-time exposure initial slope setting value stored in the long-time exposure initial slope setting register 54 to a first long-time exposure slope setting value stored in the first long-time exposure slope setting register 55. The second timing setting register 52 stores a second timing setting value. The second timing setting value specifies a timing to switch the slope of the ramp signal S1 from the first long-time exposure slope setting value stored in the first long-time exposure slope setting register 55 to the second long-time exposure slope setting value stored in the second long-time exposure slope setting register 56.

The switching circuit 53 compares a count value generated by the counter 25 in an operation for counting the reference clocks, the first timing setting value, and the second timing setting value. Then, the switching circuit 53 switches a slope setting value output by the selector 57 according to a result of the comparison.

Figure 20:
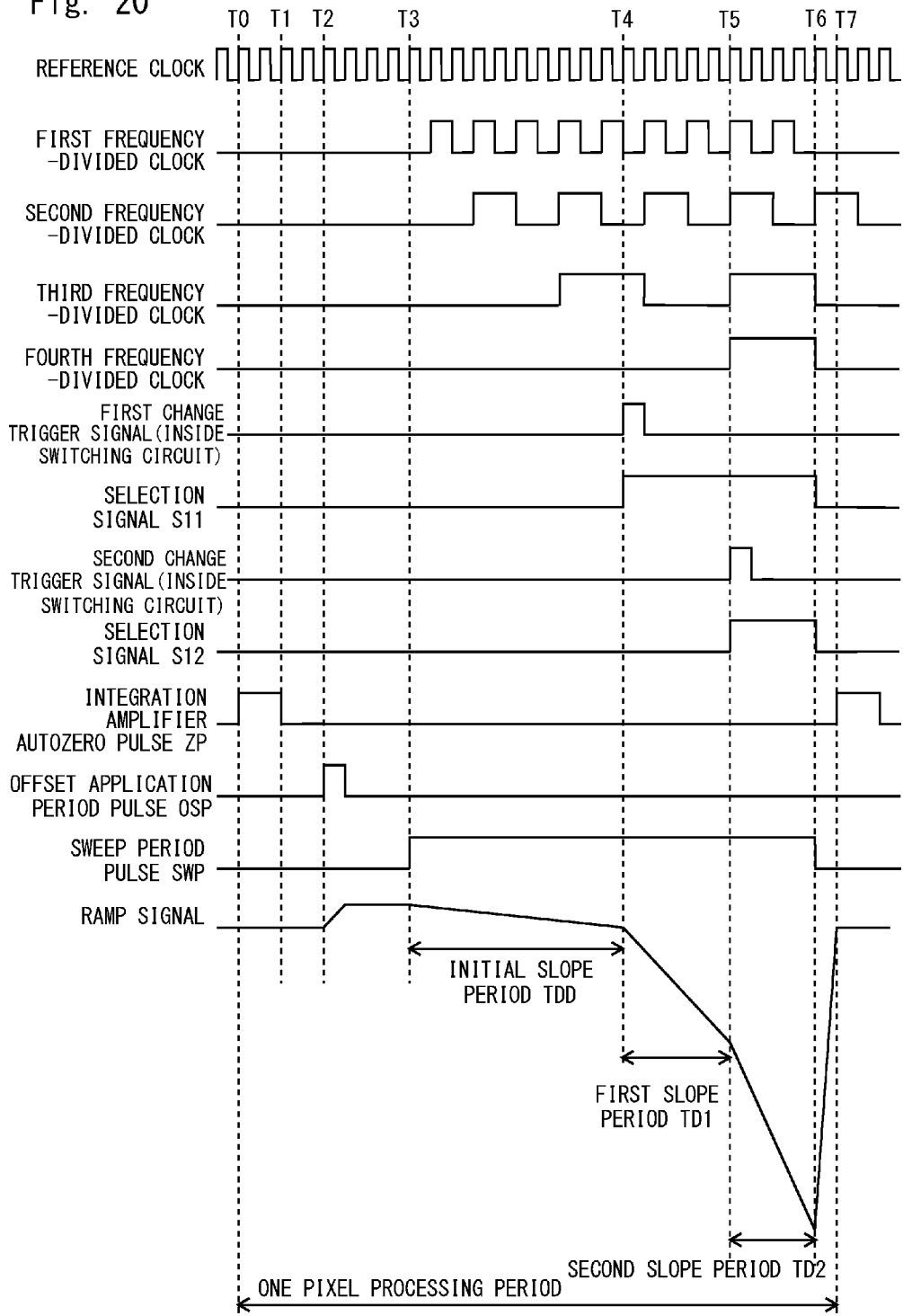
FIG. 20 is a timing chart for explaining an operation of a ramp signal generating circuit of the semiconductor device according to the fourth embodiment.

Next, an operation of the ramp waveform control circuit 20a according to the fourth embodiment will be described. FIG. 20 depicts a timing chart for explaining an operation of the ramp signal generating circuit of the semiconductor device according to the fourth embodiment. Note that as the operation of the ramp waveform control circuit 20a is substantially the same in the short-time exposure period and the long-time exposure period, FIG. 20 shows the operation of the ramp waveform control circuit 20a only in one short-time exposure period.

As depicted in FIG. 20, in the ramp waveform control circuit 20a, for example, the counter 25 outputs first to fourth frequency-divided clocks as the count value. Further, the counter 25 starts counting the reference clocks in response to switching of the sweep pulse SWP to a state indicative of the sweep period (timing T3). Then, when the count value reaches the first timing setting value, a first change trigger signal in the switching circuit 43 is shifted to a high level, and the selection signal S11 is shifted from a low level to a high level (timing T4). Then, the slope of the ramp signal S1 is switched from a slope in accordance with the short-time exposure initial slope setting value to a slope in accordance with the first short-time exposure slope setting value.

Next, when the count value reaches a second timing setting value, a second change trigger signal in the switching circuit 43 is shifted to a high level, a selection signal S12 is shifted from a low level to a high level (timing T5). Then, the slope of the ramp signal S1 is switched from a slope in accordance with the first short-time exposure slope setting value to a slope in accordance with the second short-time exposure slope setting value.

Figure 21:
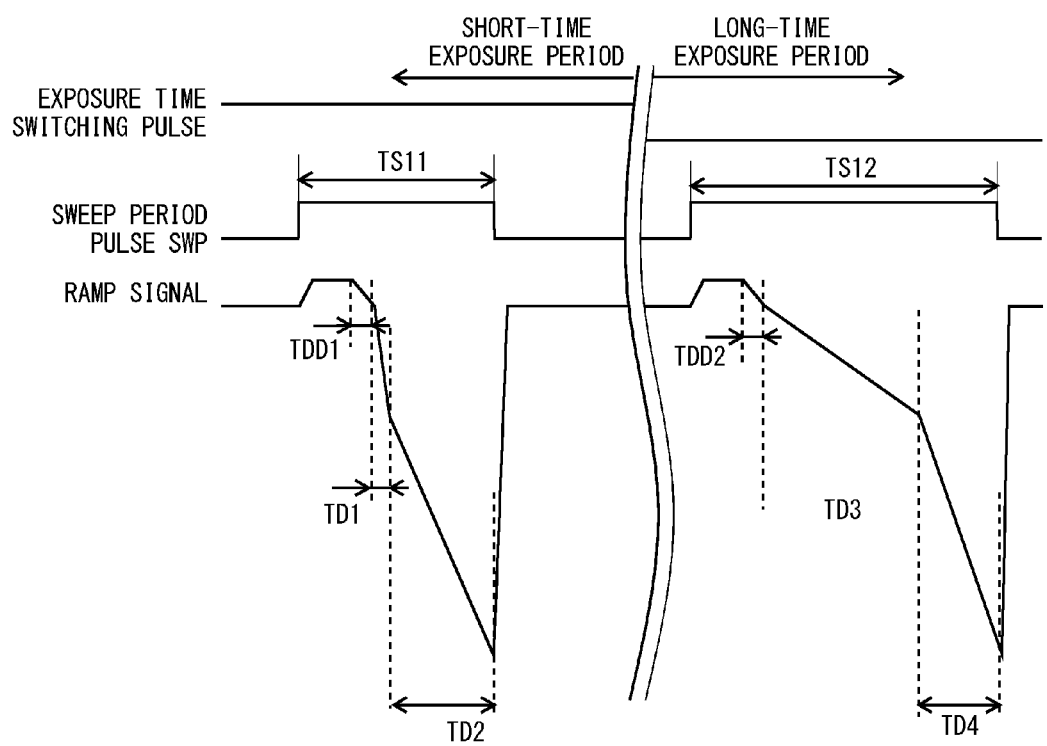
FIG. 21 is a timing chart for explaining a difference in ramp signals caused by a difference in exposure times in the ramp signal generating circuit of the semiconductor device according to the fourth embodiment.

FIG. 21 depicts a timing chart for explaining a difference in ramp signals caused by a difference in exposure times in the ramp signal generating circuit 20a of the semiconductor device according to the fourth embodiment. As depicted in FIG. 21, in the semiconductor device according to the fourth embodiment, a length in which the sweep period pulse SWP indicates the sweep period for the ramp signal S1 is shorter in the short-time exposure period than that in the long-time exposure period. In the semiconductor device according to the fourth embodiment, the slope of the ramp signal S1 is switched for a plurality of times in each of the sweep periods. The clarity of the image data obtained after the synthesizing process can be improved by such control on the change of the slope of the ramp signal S1.

Figure 22:
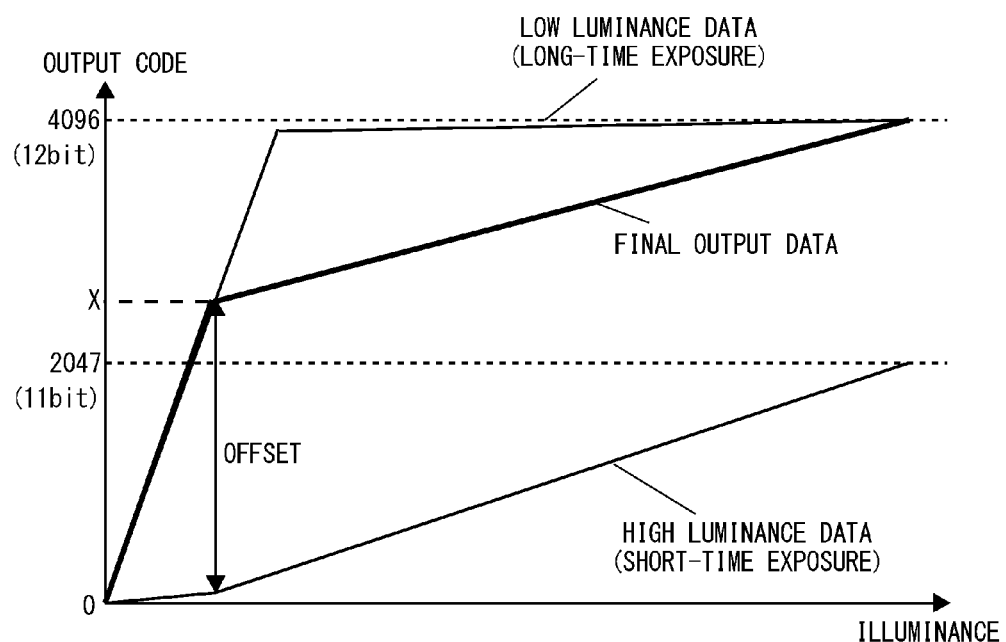
FIG. 22 is a graph for explaining a process for synthesizing digital values in the semiconductor device according to the fourth embodiment.

FIG. 22 depicts a graph for explaining a process for synthesizing digital values in the semiconductor device according to the fourth embodiment. As depicted in FIG. 22, the semiconductor device according to the fourth embodiment can reduce the output code used for parts of one of the high luminance data and the low luminance data which will be eventually replaced by the other one of the high luminance data and the low luminance data and increase the output code used for the output code reflected in the final data.

As described above, the semiconductor device according to the fourth embodiment can improve the definition of a range of luminance that corresponds to the output code which is reflected in the final data by changing the slope of the ramp signal S1 during the sweep period. Thus, the semiconductor device according to the fourth embodiment can acquire an image with clarity higher than that of an image acquired by the semiconductor device according to the first embodiment.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above. Furthermore, it is noted that, Applicant's intent is to encompass equivalents of all claim elements, even if amended later during prosecution.

The first to forth embodiments can be combined as desirable by one of ordinary skill in the art.

What is claimed is:

1. A semiconductor device comprising:
   a pixel area that accumulates charge according to an amount of incident light and outputs pixel signals;
   an analog-to-digital converter that reads the pixel signals and outputs digital values each according to magnitude of a corresponding one of the pixel signals using a ramp signal;
   a control signal generating circuit that outputs an exposure time switching pulse and a sweep period pulse, the exposure time switching pulse indicating a length of an exposure time in which light-receiving elements arranged in the pixel area receive the incident light, and the sweep period pulse specifying a time in which a ramp signal generating circuit sweeps the ramp signal;
   a ramp waveform control circuit that stores a short-time exposure slope setting value and a long-time exposure slope setting value, switches between the short-time exposure slope setting value and the long-time exposure slope setting value according to the exposure time switching pulse, and outputs the switched one of the short-time exposure slope setting value and the long-time exposure slope setting value, the short-time exposure slope setting value setting a slope of the ramp signal used when the exposure time switching pulse indicates a short-time exposure period, and the long-time exposure slope setting value being a setting value for the slope of the ramp signal used when the exposure time switching pulse indicates a long-time exposure period, and the long-time exposure slope setting value indicating a slope gentler than that indicated by the short-time exposure gradient setting value;
   a ramp waveform generating circuit that outputs a ramp signal having a slope in accordance with the slope setting value output by the ramp waveform control circuit, wherein
   the control signal generating circuit sets a sweep time specified by the sweep period pulse output in a period indicated by the exposure time switching pulse as being the short-time exposure period in such a way that it will be shorter than a sweep period specified by the sweep period pulse output in a period indicated by the exposure time switching pulse as being the long-time exposure period, and
   the analog-to-digital converter generates a first digital value corresponding to the short-time exposure period and a second digital value corresponding to the long-time exposure period.

2. The semiconductor device according to claim 1, wherein the analog-to-digital converter comprises a counter that counts reference clocks, stops a count operation of the counter in response to an inversion of a magnitude relation between a signal level of the ramp signal and a signal level of one of the pixel signals, and outputs a count value output by the counter as the digital value as of a time when the count operation is stopped.

3. The semiconductor device according to claim 1, further comprising a data holding unit that holds the first digital value and the second digital value.

4. The semiconductor device according to claim 3, further comprising a data operation unit that synthesizes the first digital value with the second digital value and outputs final image data.

5. The semiconductor device according to claim 4, wherein the data operation unit replaces a part of the second digital value that corresponds to a large output code by the first digital value and outputs a resultant value.

6. The semiconductor device according to claim 5, wherein the data operation unit replaces the second digital value having magnitude greater than a switching point, which is previously calculated, by a value obtained by adding an offset value, which is previously calculated, to the first digital value, and outputs a resultant value.

7. The semiconductor device according to claim 1, wherein, in response to a completion of the generation of the digital value corresponding to one of the short-time exposure period and the long-time exposure period, the analog-to-digital converter starts generating the digital value corresponding to another one of the short-time exposure period and the long-time exposure period.

8. The semiconductor device according to claim 1, wherein
the ramp waveform control circuit includes two or more slope setting values indicating two or more different slopes as the short-time exposure gradient setting value,
the ramp waveform control circuit includes two or more slope setting values indicating two or more different slopes as the long-time exposure gradient setting value, and
an average slope value of a plurality of the slope setting values included in the long-time exposure slope setting value is smaller than an average slope value of a plurality of the slope setting values included in the short-time exposure slope setting value.

9. A semiconductor device comprising:
a pixel area that accumulates charge according to an amount of incident light and outputs pixel signals;
an analog-to-digital converter that reads the pixel signals and outputs digital values each according to magnitude of a corresponding one of the pixel signals using a ramp signal; and
a ramp signal generating circuit that switches a slope of the ramp signal according to a length of an exposure time in which light-receiving elements arranged in the pixel area receive the incident light,
wherein the ramp signal generating circuit switches a slope of the ramp signal in such a way that the number of bits in a digital value output by the analog-to-digital converter in a period when the exposure time is short will become smaller than the number of bits in the digital value output by the analog-to-digital converter in a period when the exposure time is long.

10. The semiconductor device according to claim 9, wherein the analog-to-digital converter comprises a counter that counts reference clocks, stops a count operation of the counter in response to an inversion of a magnitude relation between a signal level of the ramp signal and a signal level of one of the pixel signals, and outputs a count value output by the counter as the digital value as of a time when the count operation is stopped.

11. The semiconductor device according to claim 9, wherein, in response to a completion of the generation of the digital value corresponding to one of the period when the exposure time is short and the period when the exposure time is long, the analog-to-digital converter starts generating the digital value corresponding to another one of the period when the exposure time is short and the period when the exposure time is long.

12. The semiconductor device according to claim 9, wherein
the analog-to-digital converter reads the pixel signals from each row for the light-receiving elements arranged in a matrix in the pixel area and performs a converting process on the pixel signals, and
the ramp signal generating circuit sweeps the ramp signal by each row and changes the slope of the ramp signal at least once during one sweep period.

* * * * *